(12) United States Patent
Hu et al.

(10) Patent No.: US 11,950,481 B2
(45) Date of Patent: Apr. 2, 2024

(54) DISPLAY PANEL AND DISPLAY DEVICE WITH GROOVES ON SURFACES OF COLOR RESIST UNITS

(71) Applicant: Wuhan Tianma Micro-Electronics Co., Ltd., Wuhan (CN)

(72) Inventors: Liang Hu, Wuhan (CN); Ai Xiao, Wuhan (CN); Linshan Guo, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 395 days.

(21) Appl. No.: 17/348,318

(22) Filed: Jun. 15, 2021

(65) Prior Publication Data

US 2022/0302216 A1 Sep. 22, 2022

(30) Foreign Application Priority Data

Mar. 22, 2021 (CN) .......................... 202110300093.X

(51) Int. Cl.
*H10K 59/38* (2023.01)
*H10K 50/86* (2023.01)

(52) U.S. Cl.
CPC ........... *H10K 59/38* (2023.02); *H10K 50/865* (2023.02)

(58) Field of Classification Search
None
See application file for complete search history.

(56) References Cited

U.S. PATENT DOCUMENTS

| 2017/0179206 A1* | 6/2017 | Lee | ...................... H10K 50/865 |
| 2022/0019008 A1* | 1/2022 | Yao | ...................... G02B 6/0065 |
| 2022/0140007 A1* | 5/2022 | Yan | ...................... H10K 59/38 |
| | | | 257/89 |

FOREIGN PATENT DOCUMENTS

| CN | 109686869 A | 4/2019 |
| CN | 112310322 A | 2/2021 |

* cited by examiner

*Primary Examiner* — Nduka E Ojeh
(74) *Attorney, Agent, or Firm* — Anova Law Group, PLLC

(57) ABSTRACT

A display panel and a display device are provided in the present disclosure. The display panel includes a substrate and an array layer disposed on a side of the substrate; a light-emitting layer, where the light-emitting layer is on a side of the array layer away from the substrate and includes a plurality of light-emitting units; and a color filter layer. The color filter layer includes a light-blocking portion and a plurality of color resist units; the plurality of color resist units is disposed corresponding to the plurality of light-emitting units; at least two color resist units of a same color have different orthographic projection shapes on a same first plane; a first plane at least includes one of a first sub-plane and a second sub-plane; the first sub-plane is a plane perpendicular to the substrate; and the second sub-plane is a plane in parallel with the substrate.

20 Claims, 17 Drawing Sheets

DISPLAY PANEL AND DISPLAY DEVICE WITH GROOVES ON SURFACES OF COLOR RESIST UNITS

CROSS-REFERENCE TO RELATED APPLICATION

This application claims the priority of Chinese Patent Application No. 202110300093.X, filed on Mar. 22, 2021, the content of which is incorporated herein by reference in its entirety.

TECHNICAL FIELD

The present disclosure generally relates to the field of display technology and, more particularly, relates to a display panel and a display device.

BACKGROUND

Organic light-emitting diode (OLED) display technology has been applied in flexible display screens because of its advantages such as self-luminescence, low power consumption, lightness and thinness, no liquid crystal fluid layer and the like. The flexible OLED display screen includes a substrate-based thin film transistor layer (TFT), a light-emitting layer, an encapsulation layer based on multilayer thin films, and a circular polarizer (POL). For a top-emitting OLED display screen, the circular polarizer may reduce the reflectivity of ambient light, increase contrast, and improve the outdoor readability of the OLED display screen, but may also lose about 58% of the light extraction; in addition, its large thickness and brittle texture may limit the development of dynamic bendable display products.

The use of color filters (CF) instead of polarizers (POL) is classified as a POL-less technology, which may not only reduce the thickness of a functional layer from about 100 µm to about 5 µm, but also increase the light extraction rate of the OLED from about 42% to about 60%.

The circular polarizer is replaced by a black matrix and a filter structure to reduce the luminous flux of ambient light entering into a display panel. However, the black matrix and filter structure themself still have a certain reflectivity, which may affect the visual effect of the display panel.

SUMMARY

One aspect of the present disclosure provides a display panel. The display panel includes a substrate and an array layer disposed on a side of the substrate; a light-emitting layer, where the light-emitting layer is on a side of the array layer away from the substrate and includes a plurality of light-emitting units; and a color filter layer. The color filter layer includes a light-blocking portion and a plurality of color resist units; the plurality of color resist units is disposed corresponding to the plurality of light-emitting units; at least two color resist units of a same color have different orthographic projection shapes on a same first plane; a first plane at least includes one of a first sub-plane and a second sub-plane; the first sub-plane is a plane perpendicular to the substrate; and the second sub-plane is a plane in parallel with the substrate.

Another aspect of the present disclosure provides a display device, including a display panel. The display panel includes a substrate and an array layer disposed on a side of the substrate; a light-emitting layer, where the light-emitting layer is on a side of the array layer away from the substrate and includes a plurality of light-emitting units; and a color filter layer. The color filter layer includes a light-blocking portion and a plurality of color resist units; the plurality of color resist units is disposed corresponding to the plurality of light-emitting units; at least two color resist units of a same color have different orthographic projection shapes on a same first plane; a first plane at least includes one of a first sub-plane and a second sub-plane; the first sub-plane is a plane perpendicular to the substrate; and the second sub-plane is a plane in parallel with the substrate.

Other aspects of the present disclosure can be understood by those skilled in the art in light of the description, the claims, and the drawings of the present disclosure.

BRIEF DESCRIPTION OF THE DRAWINGS

By reading the following detailed description of the non-limiting embodiments with reference to the accompanying drawings, other features, purposes and advantages of the present application may become more apparent, where same or similar reference signs may indicate same or similar features, and the accompanying drawings may not be drawn according to actual scales.

DETAILED DESCRIPTION

Figure 1:
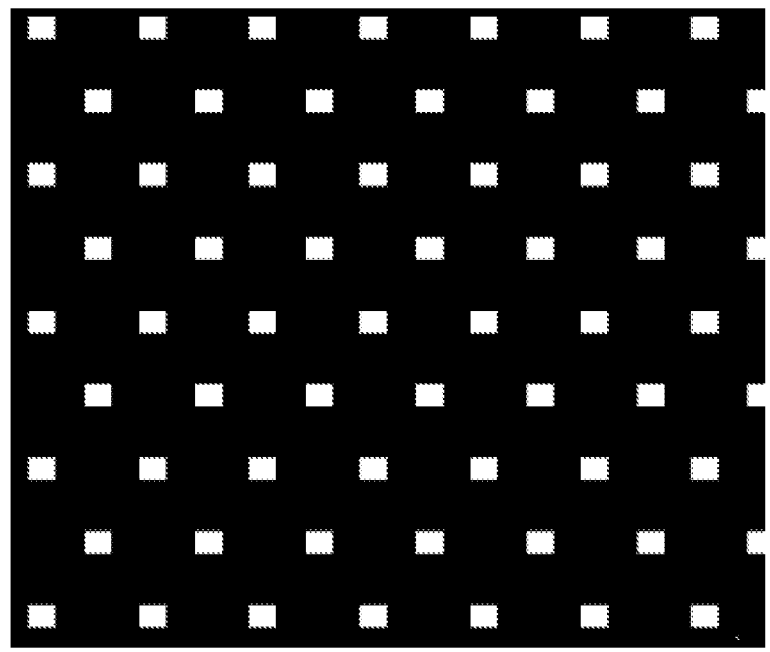
FIG. 1 illustrates a schematic of a display panel in the existing technology.

In order to clearly describe the objectives, features and advantages of the present disclosure, the present disclosure is further described with reference to accompanying drawings and various embodiments hereinafter.

It should be noted that the details described in the following description are used to substantially understand the present disclosure. However, the present disclosure may be implemented in various other manners which are different from those described herein, and those skilled in the art may make similar generalizations without departing from the connotation of the present disclosure. Therefore, the present disclosure is not limited by various embodiments disclosed below. Furthermore, in the following description, same reference numerals in the drawings indicate same or similar structures, and thus their repeated description may be omitted.

Figure 2:
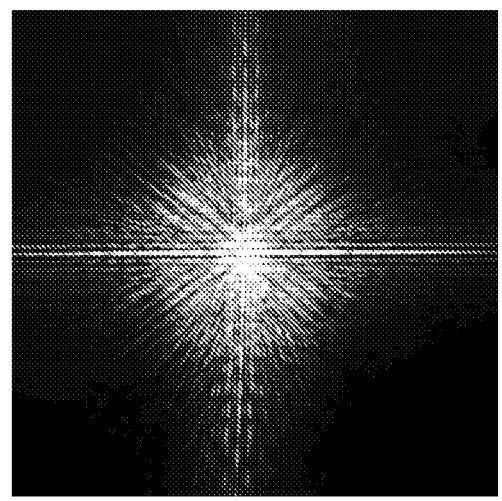
FIG. 2 illustrates a schematic of rainbow stripes diffracted by a light-emitting grating in a display panel in FIG. 1.

In the existing technology, a circular polarizer may be replaced by a black matrix and a filter structure to reduce the luminous flux of ambient light entering a display panel. However, the black matrix and the filter structure themself may still have a certain reflectivity, which may affect the visual effect of the display panel. FIG. 1 illustrates a schematic of a display panel in the existing technology; and FIG. 2 illustrates a schematic of rainbow stripes diffracted by a light-emitting grating in the display panel in FIG. 1. In order to improve the display effect of the display panel, the color resist units of a same color in the display panel may be arranged periodically (e.g., repeatedly). As shown in FIG. 1, the white block regions may be the color resist blocks of the same color, the color resist blocks corresponding to the light-emitting units in the display panel may form a dot matrix surface, and the color resist blocks of the same color may form a two-dimensional grating surface. After external light enters the interior of the display panel, the grating diffraction phenomenon may occur between the exiting external light which is reflected by the anode of the light-emitting unit and passes through the color resist blocks of the same color, or between the reflected external light which directly passes through the color resist blocks of the same color. As shown in FIG. 2, the periodically (e.g., repeatedly) arranged color resist blocks may cause noticeable color stripes on the display panel when the display panel does not emit light or the light brightness is low, which may affect the user experience. It should be noted that the light stripes shown in FIG. 2 are noticeable color stripes in actual effect, which may greatly affect the use experience.

The present disclosure provides a display panel. On the one hand, the reflection effect of the color filter layer on ambient light may be reduced to improve the light display effect of the display panel; on the other hand, the grating diffraction phenomenon occurred between the exiting external light which is reflected by the anode of the light-emitting unit and passes through the color resist blocks of the same color, or between the reflected external light which directly passes through the color resist blocks of the same color may be effectively reduced, thereby reducing or eliminating the rainbow stripe phenomenon.

Figure 3:
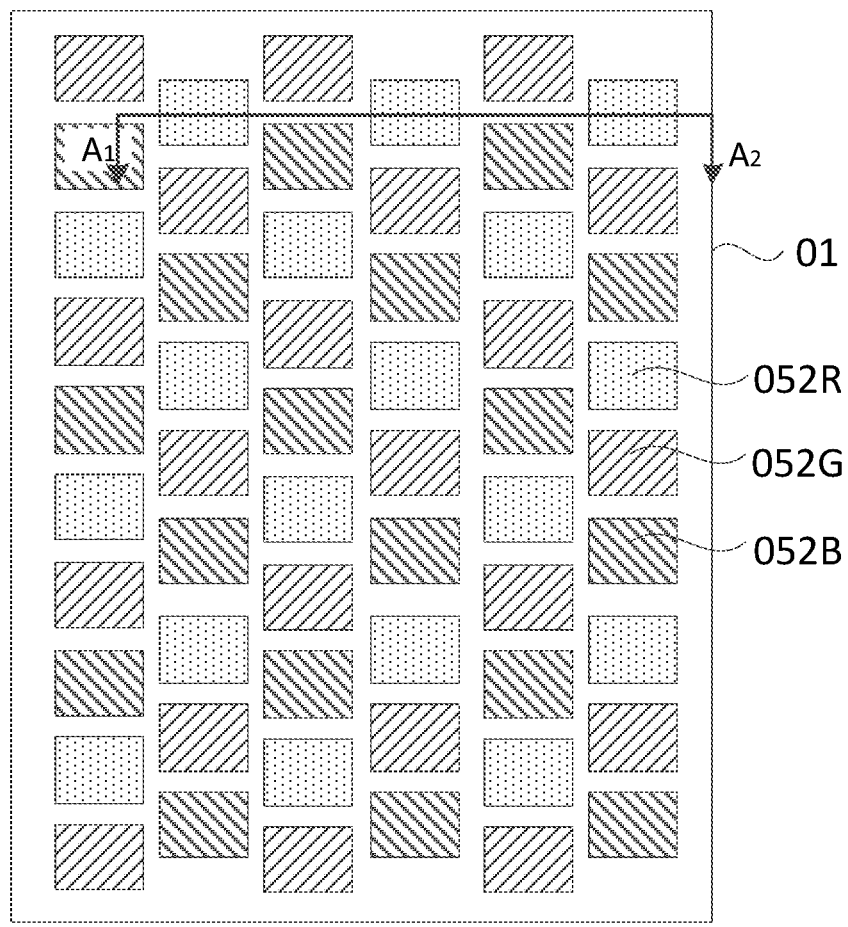
FIG. 3 illustrates a schematic of an exemplary display panel provided by various embodiments of the present disclosure.
Figure 4:
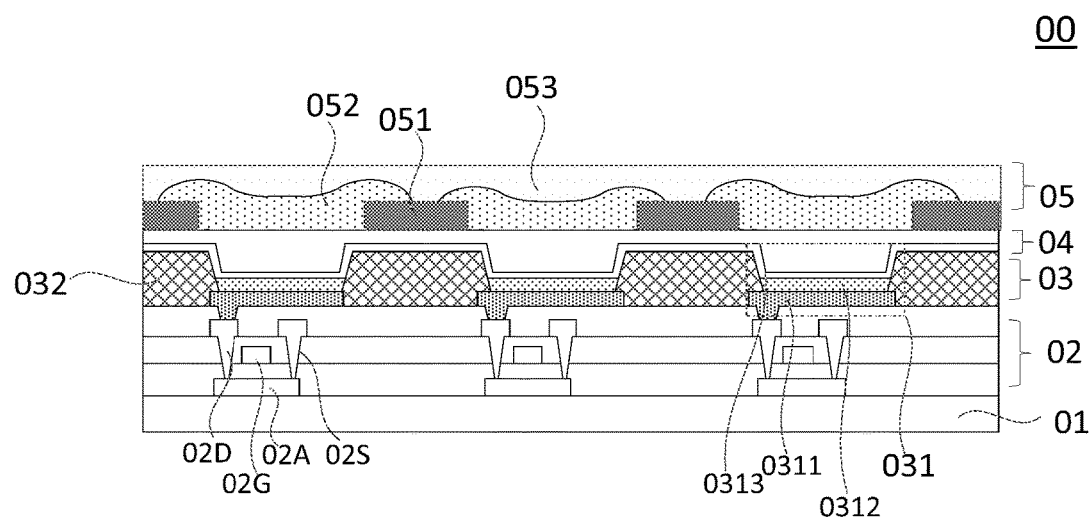
FIG. 4 illustrates an optional cross-sectional schematic of a display panel along an $A_1A_2$ direction in FIG. 3.
Figure 5:
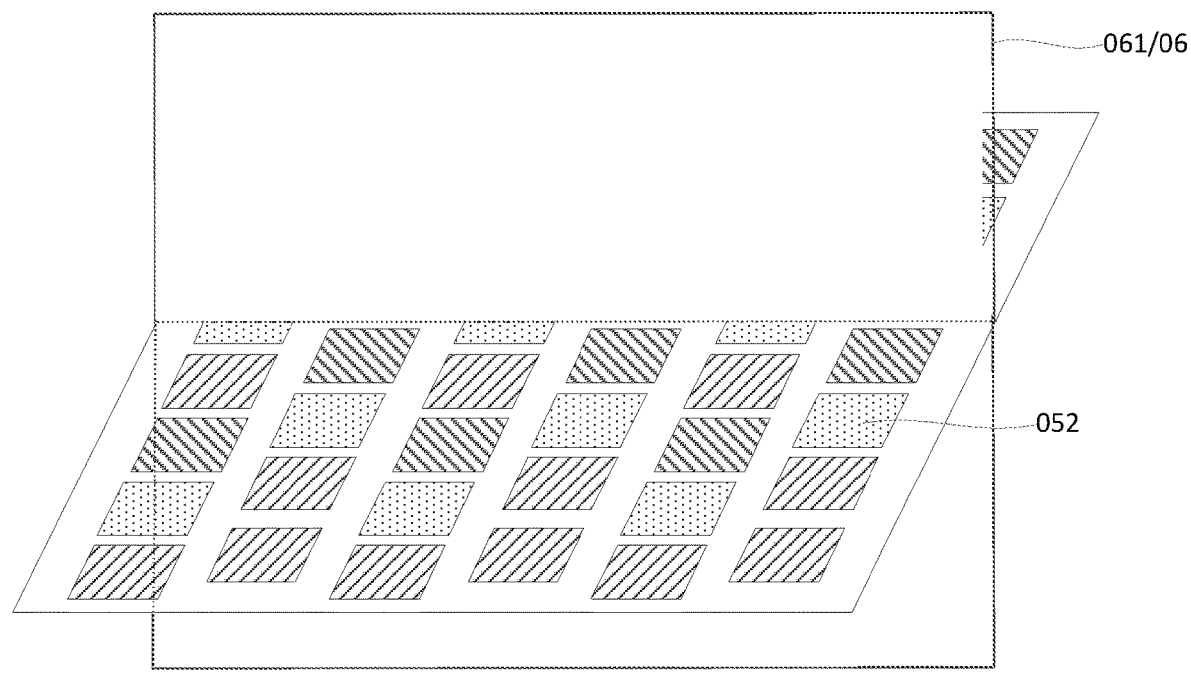
FIG. 5 illustrates a schematic of an optional positional relationship between a color resist unit and a first plane in a display panel in FIG. 3.
Figure 6:
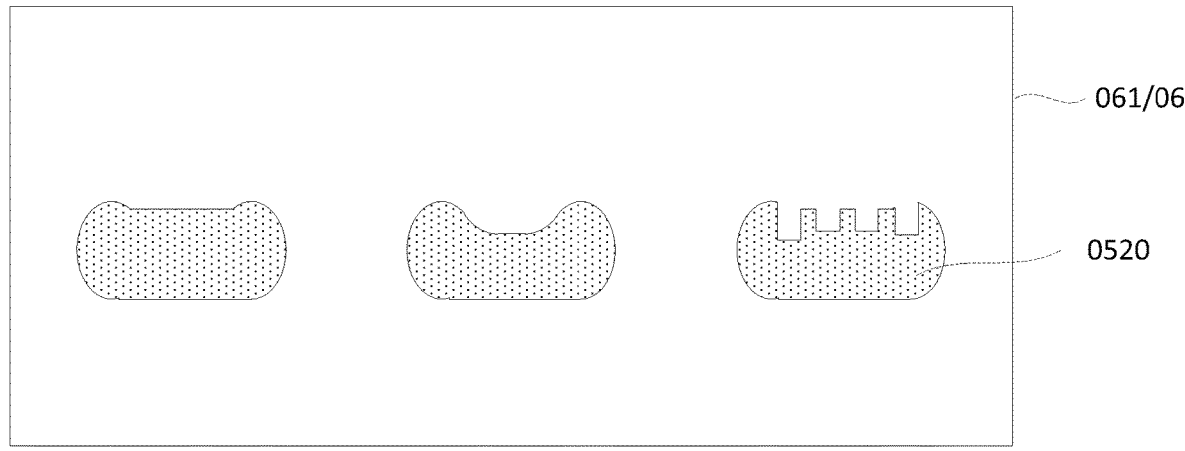
FIG. 6 illustrates a schematic of an optional exemplary projection of a color resist unit in a display panel shown in FIG. 3 on a first plane.
Figure 7:
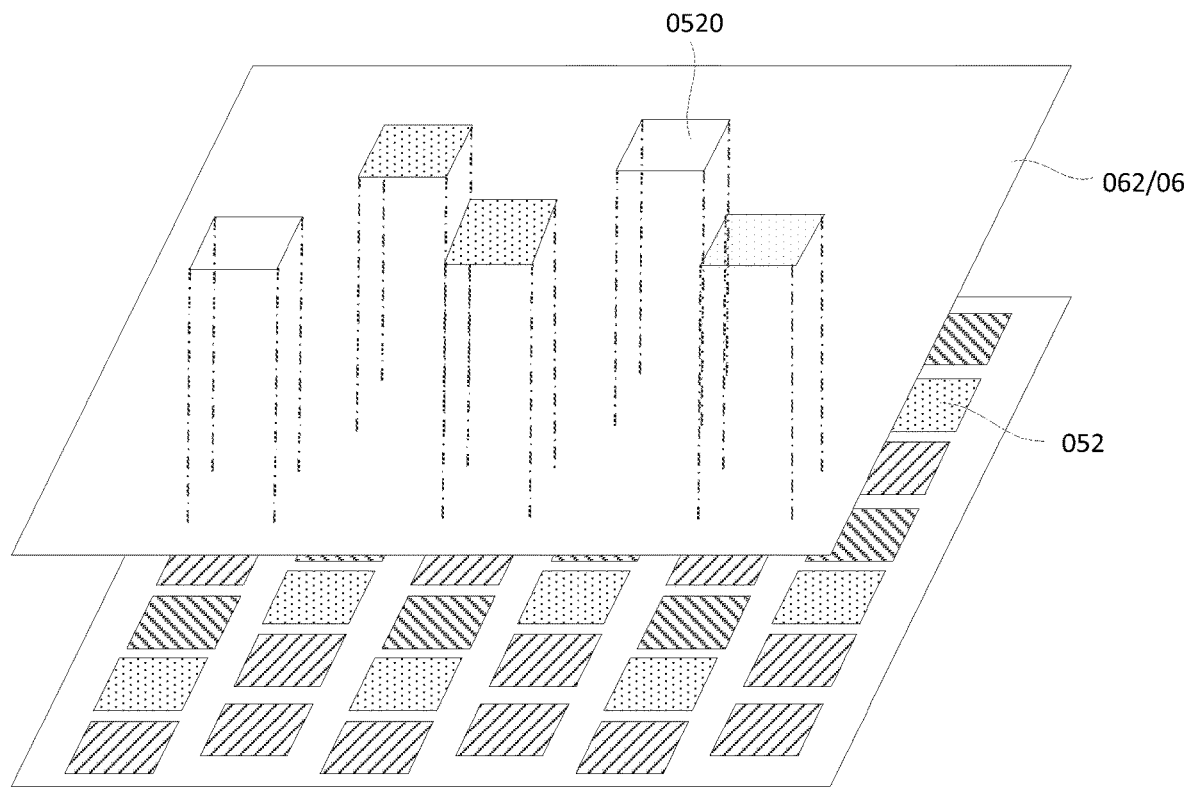
FIG. 7 illustrates a schematic of another optional exemplary projection of a color resist unit in a display panel shown in FIG. 3 on a first plane.
Figure 8:
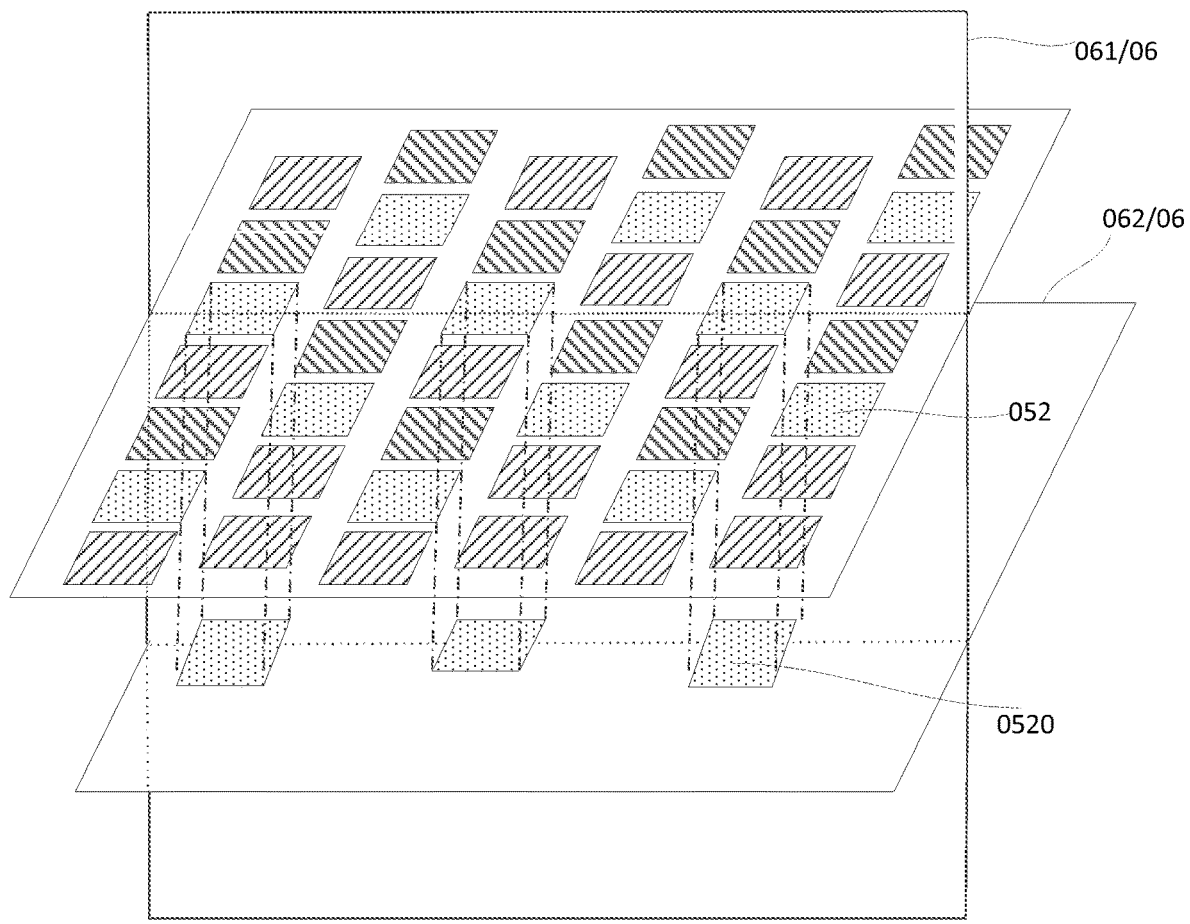
FIG. 8 illustrates a schematic of another optional exemplary projection of a color resist unit in a display panel shown in FIG. 3 on a first plane.

FIG. 3 illustrates a schematic of an exemplary display panel provided by various embodiments of the present disclosure; FIG. 4 illustrates an optional cross-sectional schematic of the display panel along an $A_1A_2$ direction in FIG. 3; FIG. 5 illustrates a schematic of an optional positional relationship between a color resist unit and a first plane in the display panel in FIG. 3; FIG. 6 illustrates a schematic of an optional exemplary projection of a color resist unit in the display panel shown in FIG. 3 on the first plane; FIG. 7 illustrates a schematic of another optional exemplary projection of a color resist unit in the display panel shown in FIG. 3 on the first plane; and FIG. 8 illustrates a schematic of another optional exemplary projection of a color resist unit in the display panel shown in FIG. 3 on the first plane.

Referring to FIGS. 3-4, a display panel 00 may include a substrate 01 and an array layer 02 where the array layer 02 is located on the side of the substrate 01, and further include a light-emitting layer 03. The light-emitting layer 03 may be located on the side of the array layer 02 away from the substrate 01; and the light-emitting layer may include a plurality of light-emitting units 031. Optionally, the array layer 02 may include a plurality of thin film transistors, and the thin film transistors may be used to drive the light-emitting units to perform display function. Optionally, the thin film transistor may include a source/drain electrode 02S/02D, a gate electrode 02G, and an active layer 02A. The present application may merely illustrate the technical solution in which the quantity of thin film transistors is one. It can be understood that there may be any quantity of thin film transistors, and the quantity may be configured according to the actual requirements of the display panel, which may not be limited according to various embodiments of the present disclosure.

Optionally, the light-emitting layer 03 may include an anode 0311, a light-emitting material layer 0312, and a cathode 0313, where the anode 0311 may be made of a material including ITO/Ag/ITO, and the cathode 0313 may be made of a material including a magnesium silver alloy. Optionally, the light-emitting units 031 may include an organic light-emitting unit, an LED light-emitting unit, or a quantum dot light-emitting unit.

Referring to FIGS. 3-4, the display panel 00 may further include a color filter layer 05. The color filter layer 05 may include a light-blocking portion 051 and a plurality of color resist units 052; and the color resist units 052 may be disposed corresponding to the light-emitting units 031. Optionally, the color resist units 052 may have a one-to-one correspondence with the light-emitting units 031. Furthermore, in the preparation process, in order to save the cost of the preparation process of the color resist unit, one color resist unit may be disposed corresponding to a plurality of light-emitting units in the display panel, and a plurality of color resist units which are originally disposed separately may be connected to improve the preparation accuracy, which may not be limited according to various embodiments of the present disclosure. Referring to FIGS. 3-8, at least two color resist units 052 of a same color may have different orthographic projection shapes on a same first plane 06; the first plane 06 may include at least one of a first sub-plane 061 and a second sub-plane 062; the first sub-plane 061 may be a plane perpendicular to the substrate 01; and the second sub-plane 062 may be a plane in parallel with the substrate 01. It should be understood that, referring to FIGS. 5-6, at least two color resist units 052 of a same color may have different shapes of orthographic projections 0520 on a same plane 061 (e.g., the first sub-plane 061) perpendicular to the substrate 01; or referring to FIG. 7, at least two color resist units 052 of a same color may have different shapes of orthographic projections 0520 on a same plane (e.g., the second sub-plane 062) in parallel with the substrate 01; or referring to FIG. 8, at least two color resist units 052 of a same color may have different shapes of orthographic projections 0520 on a same plane 061 (e.g., the first sub-plane 061) perpendicular to the substrate 01, and two color resist units 052 of a same color may have different shapes of orthographic projections 0520 on a same plane 061 (e.g., the first sub-plane 061) perpendicular to the substrate 01. The color resist units may form a diffuse reflection surface, which reduces the brightness of the noticeable color stripes on the display panel along a certain fixed direction, thereby reducing the reflection effect of the color filter layer on the ambient light. Meanwhile, the color resist units 052 corresponding to the light-emitting units 031 in the display panel may form a dot matrix surface, and the color resist units 052 of the same color may form a two-dimensional grating surface; from the direction in parallel with the substrate 01 or from the direction perpendicular to the substrate 01, the grating diffraction surface may be broken from two dimensions, the dot matrix surface formed by the color resist units 052 may be disarranged, and the periodical (e.g., repeated) configuration of the color resists may be disarranged, thereby reducing the grating diffraction and the color separation.

Optionally, the first sub-plane may be a plane which is in parallel with the column direction or the row direction of the display panel and simultaneously passes through a plurality of color resist units of a same color. At such point, the projection of the color resist unit on the first sub-plane may be understood as the cross-sectional shape of the first sub-plane passing through the color resist unit. It should be noted that a certain direction may be in parallel with an another plane or two planes may be in parallel with each other; and the so-called parallel may be understood as complete parallel or substantial parallel.

Optionally, the display panel 00 may further include a thin film encapsulation layer 04; and the thin film encapsulation layer 04 may be located between the light-emitting layer 03 and the color filter layer 05. Optionally, the thin film encapsulation layer 04 may include one, two, three or more film layers; and the thin film encapsulation layer 04 may include an organic layer and an inorganic layer disposed alternately. In the display panel provided in one embodiment, the substrate 01 may be a flexible substrate having the characteristic of being able to be bent. Optionally, the film encapsulation layer 04 may have desirable bendability. The display panel provided in one embodiment may be bent or folded. The material and film structure of the thin film encapsulation layer 04 may not be limited according to various embodiments of the present disclosure. Optionally, the display panel may further include a pixel definition layer 032. The pixel definition layer 032 may include a plurality of pixel openings, and the light-emitting units 031 may be located in the pixel openings. Optionally, the color filter layer 05 may further include a filter medium layer 053; and the filter medium layer 05 may be at a side of the color filter layer 05 away from the substrate 01. On the one hand, the filter medium layer 05 may prevent the color resist units 052 from being scratched in a subsequent process, thereby protecting the color resist units 052; on the other hand, the filter medium layer 05 may compensate for the difference in the surface of the display panel in the above-mentioned process, to flatten the display panel, which may provide a flat surface for the subsequent process to reduce the risk of film breakage.

Compared with the existing technology, for the display panel provided in the present disclosure, on the one hand, a diffuse reflection surface may be formed at the color resist unit, which reduces the brightness of the noticeable color stripes on the display panel along a certain fixed direction, thereby reducing the reflection effect of the color filter layer on the ambient light, improving the display contrast of the display panel and improving the light display effect of the display panel; on the other hand, the color resist units of a same color may be differentiated in at least one dimension, the dot matrix surface formed by at least one color resist unit may be changed, and correspondingly, the two-dimensional grating surface formed by color resist units of a same color may be broken to obviously break the regularity of grating diffraction, which may effectively reduce the grating diffraction phenomenon occurred between the exiting external light which is reflected by the anode of the light-emitting unit and passes through the color resist blocks of the same color, or between the reflected external light which directly passes through the color resist blocks of the same color.

Optionally, the color resist units may include a first color resist unit and a second color resist unit of a same color. The surface of the first color resist unit away from the substrate may be a first surface; the first color resist unit may include a plurality of first grooves; the first surface may be recessed toward the side of the substrate to form the first grooves; and the depths of at least two first grooves may be different. The surface of the second color resist unit away from the substrate may be a second surface; the second color resist unit may include a plurality of second grooves; the second surface may be recessed toward the side of the substrate to form the second grooves, and the depths of at least two second grooves may be different.

Figure 9:
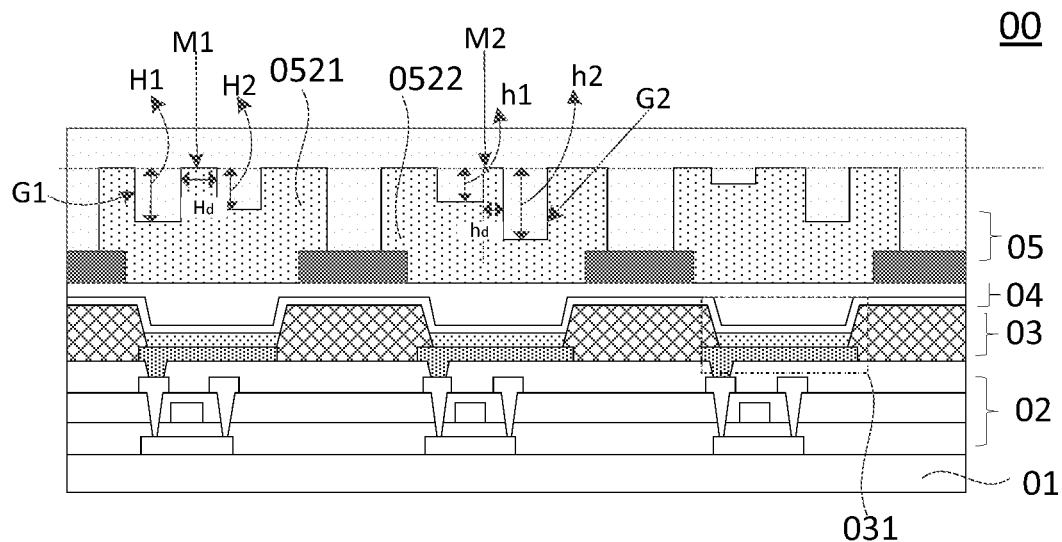
FIG. 9 illustrates another optional cross-sectional schematic of a display panel along an $A_1A_2$ direction in FIG. 3.
Figure 10:
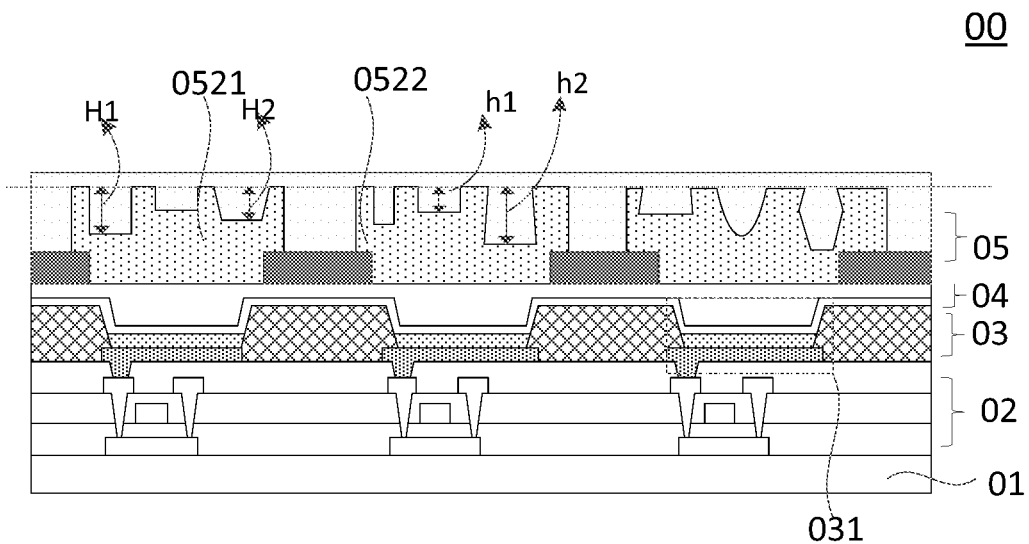
FIG. 10 illustrates another optional cross-sectional schematic of a display panel along an $A_1A_2$ direction in FIG. 3.

FIG. 9 illustrates another optional cross-sectional schematic of the display panel along an $A_1A_2$ direction in FIG. 3; and FIG. 10 illustrates another optional cross-sectional schematic of the display panel along an $A_1A_2$ direction in FIG. 3. As shown in FIGS. 9-10, the color resist units 052 may include a first color resist unit 0521 and a second color resist unit 0522 with a same color. The colors of the light, which is emitted from the light-emitting units 031 and passes through the first color resist unit 0521 and the second color resist unit 0522, may be same. The surface of the first color resist unit 0521 on the side away from the substrate 01 may be a first surface M1; and the first color resist unit 0521 may include a plurality of first grooves G1. The first groove G1 may be a groove formed by recessing the first surface M1 toward the side of the substrate 01, that is, the first groove may be located on the surface of the first color resist unit 0521 away from the substrate 01. The depths of at least two first grooves G1 may be different. For example, the depth of one first groove G1 is H1, and the depth of another first groove G1 is H2, where H1≠H2. The surface of the second color resist unit 0522 on the side away from the substrate 01 may be a second surface M2; and the second color resist unit 0522 may include a plurality of second grooves G2. The second groove G2 may be a groove formed by recessing the second surface M2 toward the side of the substrate 01, that is, the second groove G2 may be located on the surface of the second color resist unit 0522 away from the substrate 01. The depths of at least two second grooves G2 may be different. For example, the depth of one second groove G2 is h1, and the depth of another second groove G2 is h2, where h1≠h2.

The first grooves G1 of different depths may be disposed, such that the surface of the first color resist unit 0521 away from the substrate 01 may form an uneven structure; and the second grooves G2 of different depths may be disposed, such that the surface of the second color resist unit 0522 away from the substrate 01 may form an uneven structure. Meanwhile, a rough diffuse reflection surface may be formed on the surface of the color resist units of the same color away from the substrate 01, which reduces the brightness of the noticeable color stripes on the display panel along a certain fixed direction and improve the display contrast. Furthermore, the grooves may be disposed to change the roughness of the diffuse reflection surfaces of the color resist units, thereby being more convenient in the formation process. For example, a halftone mask process or a plasma treatment process may be used to form the grooves of different depths, which may simplify the process and save the preparation cost.

A certain quantity of grooves (the first groove/the second groove) may be disposed in the color resist units to change the projection shapes of the color resist units. Optionally, in at least 10*10 (10 rows and 10 columns) color resist units, the grooves on the color resist units may not be repeatable.

Optionally, as shown in FIG. 9, the shortest distance between two adjacent first grooves G1 is $H_d$, and the shortest distance between two adjacent second grooves G2 is $h_d$, where $H_d$ is not equal to $h_d$. That is, the shortest distance between adjacent grooves in the first color resist unit 0521 may be different from the shortest distance between adjacent grooves in the second color resist unit 0522; and correspondingly, the formed shapes of the color resist units may be different. Therefore, based on the above-mentioned description, the regularity of the grating diffraction surface formed by the same color resist units may be broken, which may effectively reduce the grating diffraction phenomenon occurred between the exiting external light which is reflected by the anode of the light-emitting unit and passes through the color resist blocks of the same color, or between the reflected external light which directly passes through the color resist blocks of the same color.

Optionally, referring to FIG. 10, the shapes of the first grooves G1 and the second grooves G2 may also include a "narrow upper and wide bottom" cross section, an "arc-shaped" cross section, or a "trapezoidal" cross section, and/or any other suitable cross sections, which may not be limited according to various embodiments of the present disclosure.

Figure 11:
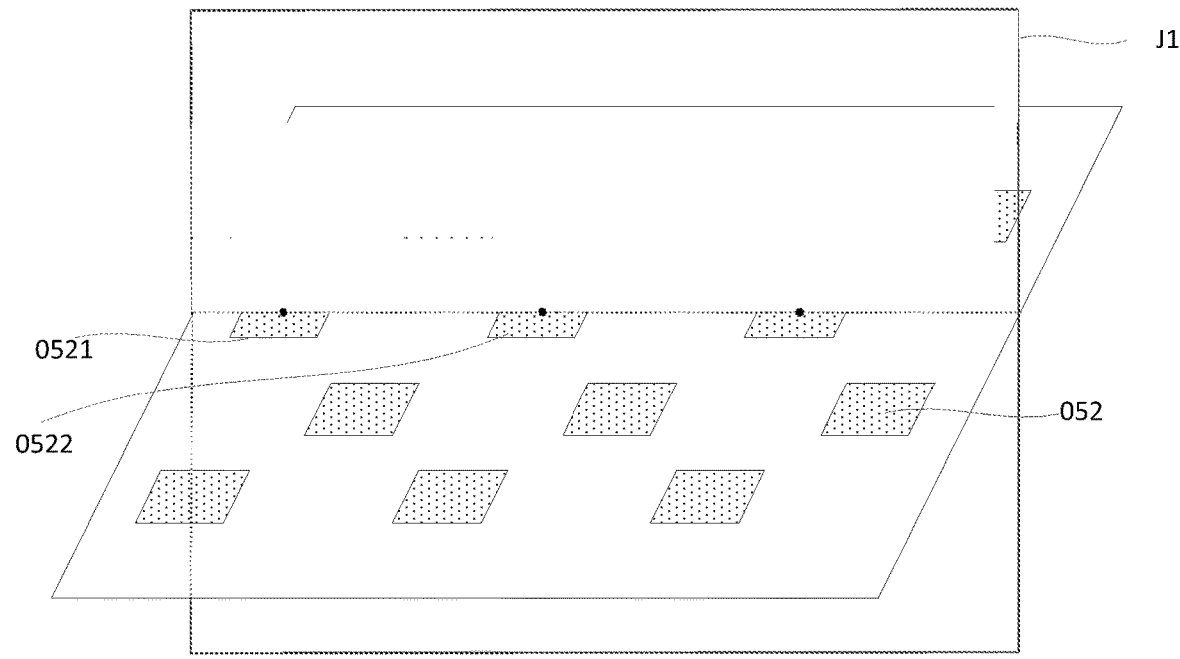
FIG. 11 illustrates a positional relationship schematic of a display panel and a first cross section in FIG. 3.

Optionally, the first color resist unit and the second color resist unit may have different patterns in the first cross section. The first cross section may be the plane perpendicular to the plane where the substrate is located and passing through the geometric center of the first color resist unit and the geometric center of the second color resist unit. FIG. 11 illustrates a positional relationship schematic of the display panel and the first cross section in FIG. 3; and FIG. 12 illustrates a cross-sectional schematic of the color resist unit in the first cross section of the display panel in FIG. 11.

Figure 12:
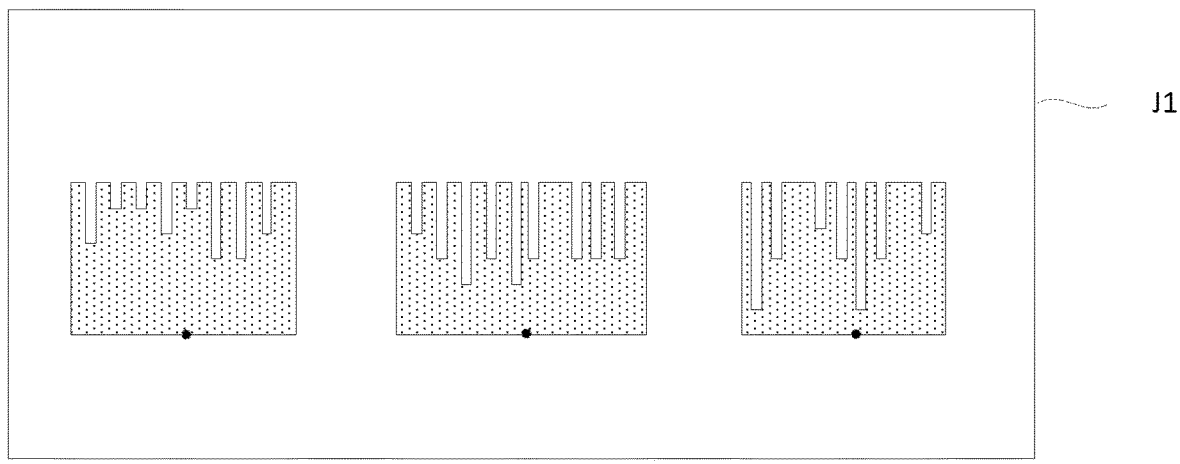
FIG. 12 illustrates a cross-sectional schematic of a color resist unit in a first cross section of a display panel in FIG. 11.

As shown in FIGS. 11-12, the first color resist unit 0521 and the second color resist unit 0522 may have different patterns in the first section J1; and the first section J1 may be the plane perpendicular to the plane of the substrate 01 and passing through the geometric center of the first color resist unit 0521 (the black dot in the color resist unit in FIG. 11) and the geometric center of the second color resist unit 0522. It can be understood that the patterns of the first cross section J1 passing through the first color resist unit 0521 and the second color resist unit 0522 may be different. That is, at least in a certain position or a certain region, two color resist units of a same color may not be exactly same, which may change the morphology of the color resist units as the dot matrix surface, reduce the brightness of the noticeable color stripes appearing on the display panel along a certain fixed direction, and also reduce the color separation phenomenon. Referring to FIG. 12, the cross-sections of the color resist units of a same color in the first cross-section may be different patterns. Optionally, as shown in FIG. 12, the cross-sectional patterns may be different through the grooves of different depths. Optionally, the manner of forming different cross-sectional patterns in the first cross-section of the same color resist units may further include roughening the color resist units away from the surface of the substrate to form irregular groove patterns. Or, different groove patterns may be configured on the surfaces of the color resist units; regardless of that the depths of the grooves on the surfaces of the color resist units are same or different, the cross-section patterns of the same color resist units in the first cross section may be different.

Figure 13:
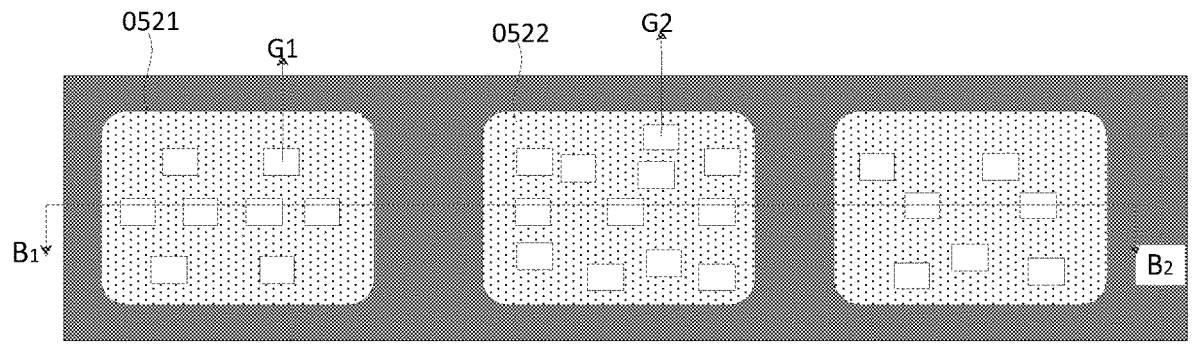
FIG. 13 illustrates a schematic top view of an exemplary color resist unit of a display panel provided by various embodiments of the present disclosure.
Figure 14:
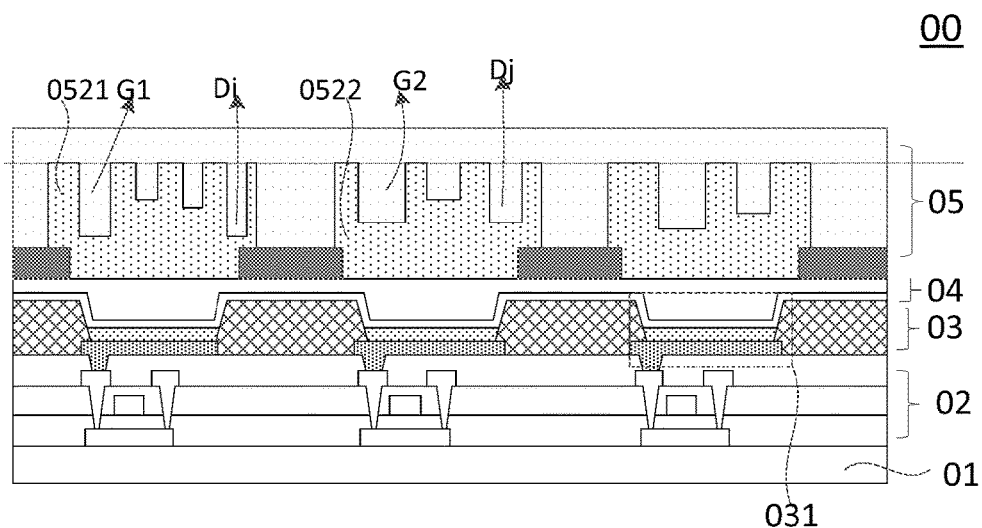
FIG. 14 illustrates a cross-sectional schematic of a display panel along a $B_1B_2$ direction in FIG. 13.

FIG. 13 illustrates a schematic top view of an exemplary color resist unit of the display panel provided by various embodiments of the present disclosure; FIG. 14 illustrates a cross-sectional schematic of the display panel along a $B_1B_2$ direction in FIG. 13; and FIG. 15 illustrates a three-dimensional schematic of an exemplary color resist unit of the display panel provided by various embodiments of the present disclosure.

Figure 15:
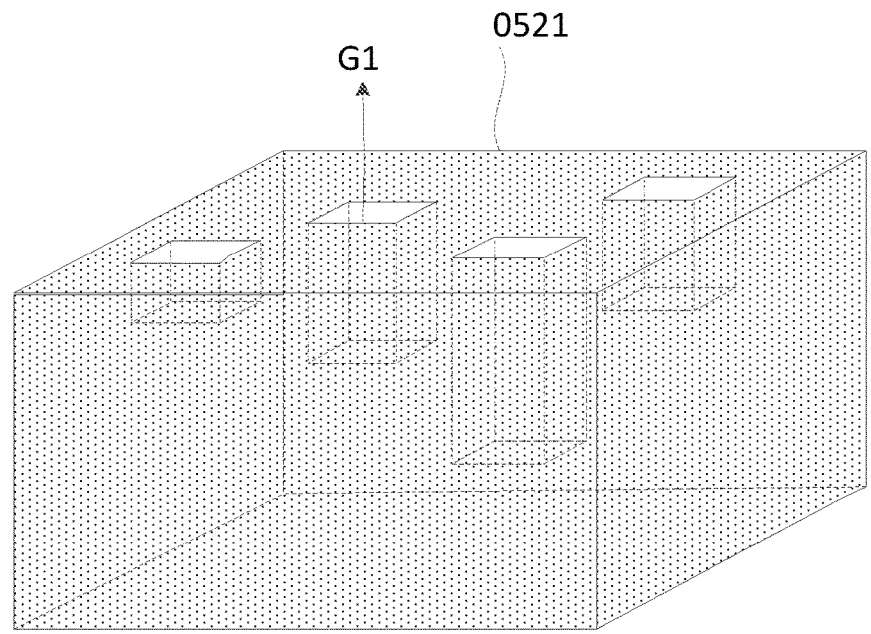
FIG. 15 illustrates a three-dimensional schematic of an exemplary color resist unit of a display panel provided by various embodiments of the present disclosure.

As shown in FIGS. 13-15, the first grooves G1 may include M types of groove portions with different depths, and the depth of the i-th groove portion is Di, where i∈{1, . . . , M}; and the second grooves G2 may include N types of groove structures with different depths, and the depth of the j-th groove structure is dj, j∈{1, . . . , N}, where M≥N, M is a positive integer, and N is a positive integer. That is, the first grooves of different depths may be understood as different types of first grooves, then the first color resist units may include M types of the first grooves; and the second grooves with different depths may be understood as different types of second grooves, then the second color resist units may include N types of second grooves, where M>N. At this point, the first color resist unit may have at least one groove having a depth which may not have a corresponding second groove in the second color resist unit. In such case, the first color resist units and the second color resist units may not be completely equivalent, and the regularity of the grating diffraction surface formed by the same color resist units may be broken, which may effectively reduce the grating diffraction phenomenon occurred between the exiting external light which is reflected by the anode of the light-emitting unit and passes through the color resist blocks of the same color, or between the reflected external light which directly passes through the color resist blocks of the same color. It should be noted that the groove portion and the groove structure may not be labeled in the drawings. It can be understood that the i-th groove portion represents the first groove with the depth of Di, and the j-th groove structure represents the second groove with the depth of dj. When i and j are different values, the depths of the corresponding grooves may also be different.

In order to show the structures of the present disclosure in more detail, the top view shown in FIG. 13 and the three-dimensional schematic shown in FIG. 15 may be referred. The quantity of grooves may be merely exemplary, which may not be limited according to various embodiments of the present disclosure. That is, two or more first grooves with a same depth may be included in the first color resist unit.

Optionally, M=N, Di=dj, the position of the i-th groove portion in the first color resist unit 0521 may be different from the position of the j-th groove structure in the second color resist unit 0522; or the arrangement manner of the i-th groove portion in the first color resist unit 0521 may be different from the arrangement manner of the j-th groove structure in the second color resist unit 0522.

Figure 16:
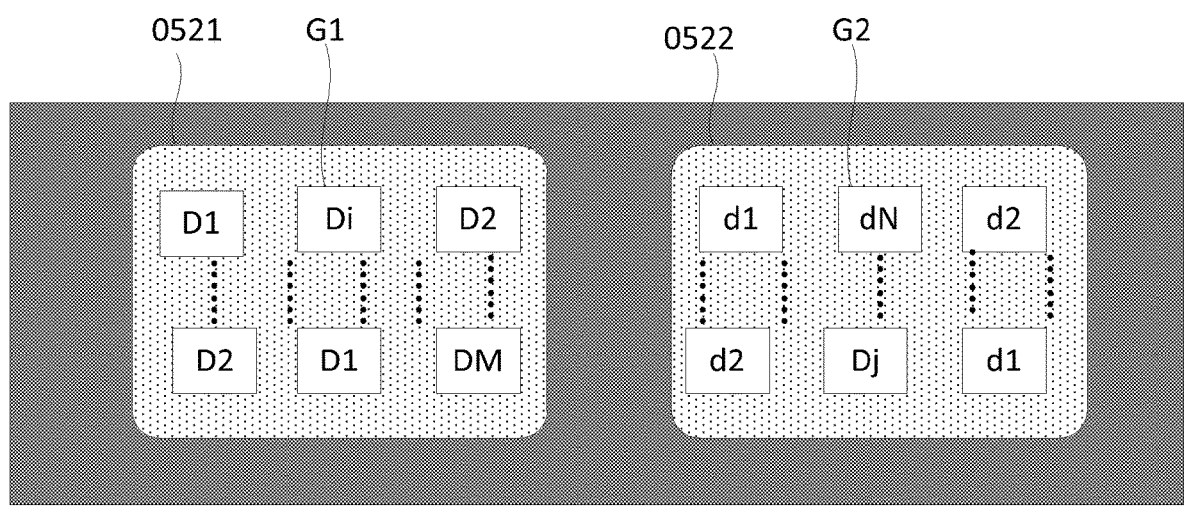
FIG. 16 illustrates a schematic top view of another exemplary color resist unit of a display panel provided by various embodiments of the present disclosure.
Figure 17:
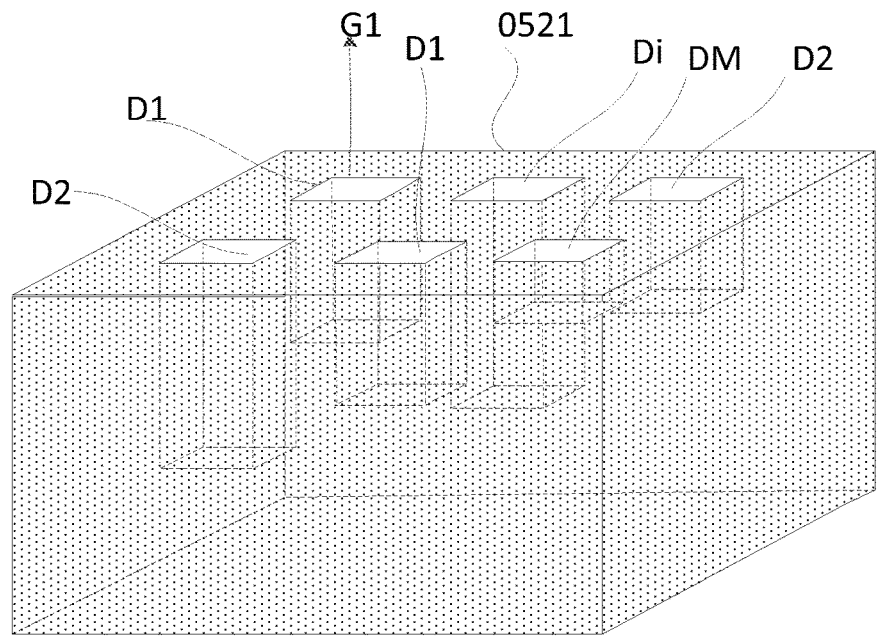
FIG. 17 illustrates a three-dimensional schematic of a color resist unit of a display panel in FIG. 16.

FIG. 16 illustrates a schematic top view of another exemplary color resist unit of the display panel provided by various embodiments of the present disclosure; and FIG. 17 illustrates a three-dimensional schematic of the color resist unit of the display panel in FIG. 16. Referring to FIGS. 16-17, FIG. 16 illustrates a top view of the first color resist unit, and FIG. 17 illustrates a three-dimensional schematic of the first color resist unit 0521. The first color resist unit 0521 may include M types of the first grooves G1. The first groove portion represents that the depth of the first groove is D1; the i-th groove portion represents that the depth of the first groove is Di; and the M-th groove portion represents that the depth of the first groove is DM. Referring to FIG. 16, the second color resist unit 0522 may include N types of the second grooves G2. The first groove structure represents that the depth of the second groove is d1; the j-th groove structure represents that the depth of the second groove is dj; and the N-th groove structure represents that the depth of the second groove is dN. That is, the first color resist unit 0521 may include the first grooves G1 with M depths, and the second color resist unit 0522 may include the second grooves G2 with N depths, where M=N. It should be noted that FIGS. 16-17 may merely illustrate M is equal to N, exemplarily. The values of M and N may not be limited according to various embodiments of the present disclosure; for example, M=6, and N=6.

Optionally, M=N, Di=dj, the groove depth Di corresponding to the i-th groove portion may be equal to the groove depth dj of the j-th groove structure, and the position of the i-th groove portion in the first color resist unit 0521 may be different from the position of the j-th groove structure in the second color resist unit 0522. That is, referring to FIG. 13, the positions of the i-th groove portion (the first groove G1) and the j-th groove structure (the second groove G2) of the same groove depth on the first color resist unit 0521 and the second color resist unit 0522 may be different. In one embodiment, the grooves of the same depth may be disposed at different positions of the first color resist unit and the second color resist unit. That is, same positions in the first color resist unit 0521 and the second color resist unit 0522 of the same color may be designed differently. At this point, the projections of the corresponding first color resist unit and the second color resist unit on the first surface may be necessarily different, thereby improving the color separation phenomenon of the display panel.

Figure 18:
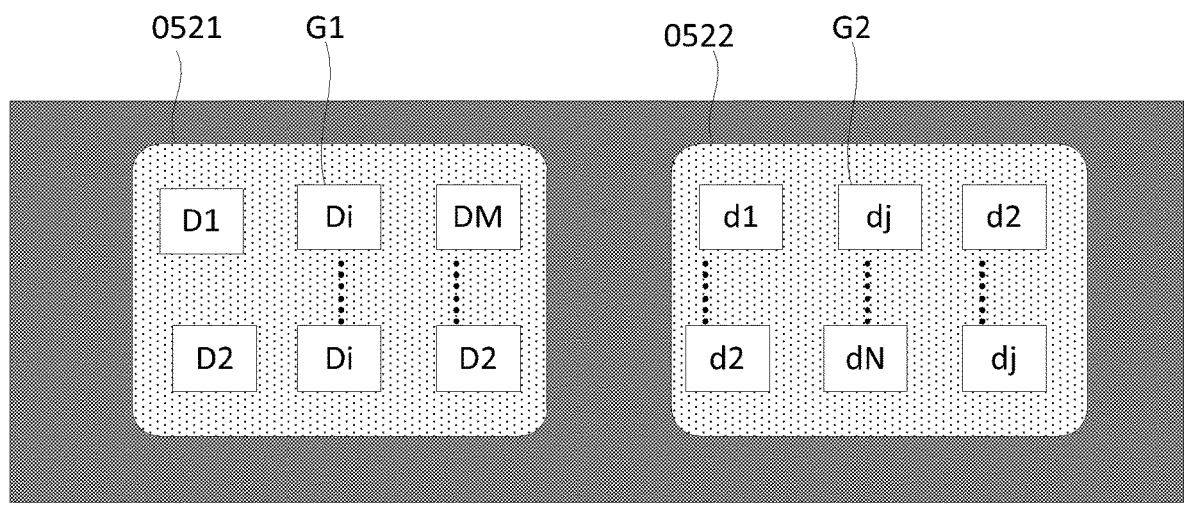
FIG. 18 illustrates a schematic top view of another exemplary color resist unit of a display panel provided by various embodiments of the present disclosure.

Optionally, M=N, Di=dj, the arrangement manner of the i-th groove portion in the first color resist unit 0521 may be different from the arrangement manner of the j-th groove structure in the second color resist unit 0522. FIG. 18 illustrates a schematic top view of another exemplary color resist unit of the display panel provided by various embodiments of the present disclosure. Referring to FIG. 18, the first color resist unit 0521 may include a plurality of groove portions, and the second color resist unit 0522 may include a plurality of groove structures. The arrangement manner of the i-th groove portion in the first color resist unit 0521 may be different from the arrangement manner of the j-th groove structure in the second color resist unit 0522. The grooves with a same depth may have different arrangement manners on the corresponding color resist units, such that the color resist units may be configured to be differentiated, and the regularity of the dot matrix surface of the color resist unit may be broken, thereby improving the diffraction rainbow pattern.

Optionally, Di=dj, the area ratio of the i-th groove portion (e.g., all i-th groove portions with a same depth) in the first color resist unit is C, and the area ratio of the j-th groove structure in the second color resist unit is E, where C≠E. The i-th groove portion and the j-th groove structure of a same depth may have different area ratios in the corresponding color resist units, such that the color resist units may be configured to be differentiated, and the regularity of the dot matrix surface of the color resist unit may be broken, thereby improving the diffraction rainbow pattern. It can be understood that the area ratio of all groove portions in the first groove may be the ratio of the sum of the areas of the orthographic projections of all groove portions on the substrate to the area of the orthographic projection of the first color resist unit on the substrate.

Optionally, Di=dj, the shortest distance between two adjacent groove portions is mi, and the shortest distance between two adjacent groove structures is mj, where mi≠mj. The shortest distance between the groove portions of a same depth may be different from the shortest distance between the groove structures of a same depth, such that the regularity of the dot matrix surface of the color resist unit may be broken by differential configuration of the distance between the color resist units, thereby improving the diffraction rainbow pattern. It can be understood that the shortest distance between two adjacent groove portions may be the linear distance between the geometric centers of the two adjacent groove portions on the orthographic projection of the substrate.

Figure 19:
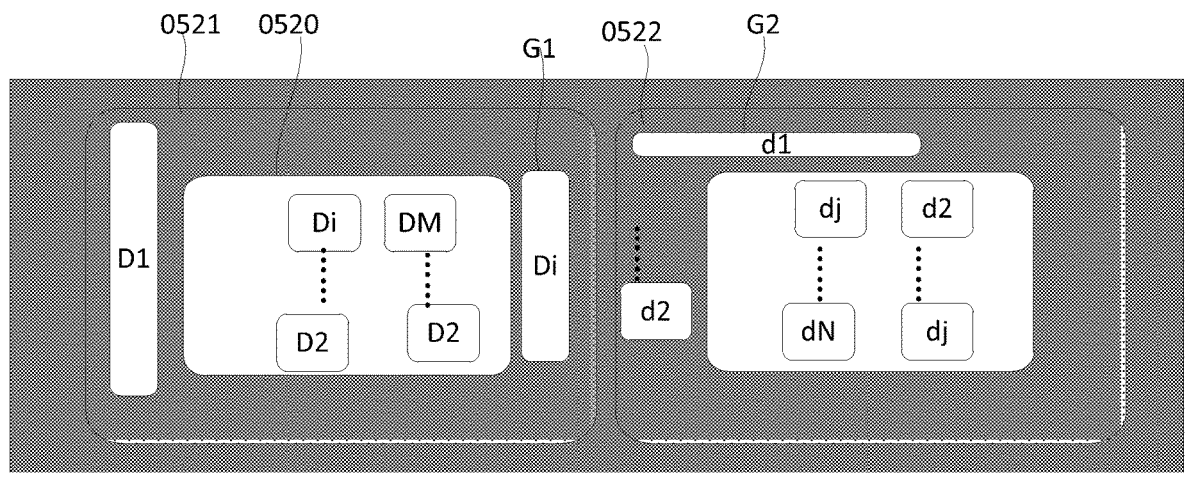
FIG. 19 illustrates a schematic top view of another exemplary color resist unit of a display panel provided by various embodiments of the present disclosure.

Optionally, the orthographic projection of the color resist unit on the substrate and the orthographic projection of the black matrix on the substrate may have an overlapped region; and the first groove and the second groove may be located at the overlapped region. FIG. 19 illustrates a schematic top view of another exemplary color resist unit of the display panel provided by various embodiments of the present disclosure. As shown in FIG. 19, the light-blocking portion may include a plurality of light-blocking portion openings 0520; and the color resist units (the first color resist unit 0521/the second color resist unit 0522) may be overlapped with the light-blocking portion, respectively. At least a part of the first grooves G1 or at least a part of the second grooves G2 may be located at the overlapped region. Compared with the above-mentioned embodiments, in one embodiment, the problem of the regular diffraction stripes of the color resist unit may be resolved; meanwhile, disposing the grooves at the overlapped region may reduce the influence of light exited from the front viewing angle of the light-emitting units; furthermore, disposing the grooves at the overlapped region may reduce the light exiting path passing through the color resist unit at the large viewing angle, and balance the color shift phenomenon caused by the brightness attenuation of the front viewing angle and the large viewing angle.

Optionally, the first color resist unit and the second color resist unit may each include n*m sub-modules arranged in an array of n rows and m columns. The thickness of the corresponding f-th row and g-th column sub-module in the first color resist unit may not be equal to the thickness of the corresponding f-th row and g-th column sub-module in the second color resist unit, where f≤n and g≤m. The first color resist unit may include n rows and m columns of sub-modules, and the second color resist unit may also include n rows and m columns of sub-modules. The thickness of the sub-module in the f-th row and g-th column in the first color resist unit is $Q_{fg}$; and the thickness of the sub-module in the f-th row and g-th column in the second color resist unit is $q_{fg}$, where $Q_{fg} \neq q_{fg}$. That is, the thicknesses of the sub-modules (i.e., the thicknesses of the color resist units) at a same (e.g., corresponding) position of the first color resist unit and the second color resist unit may be different. In such way, the regularity of the dot matrix surface using the color resist units of a same color may be changed through the thickness differential configuration, thereby reducing the grating diffraction and reducing the rainbow stripe phenomenon.

Figure 20:
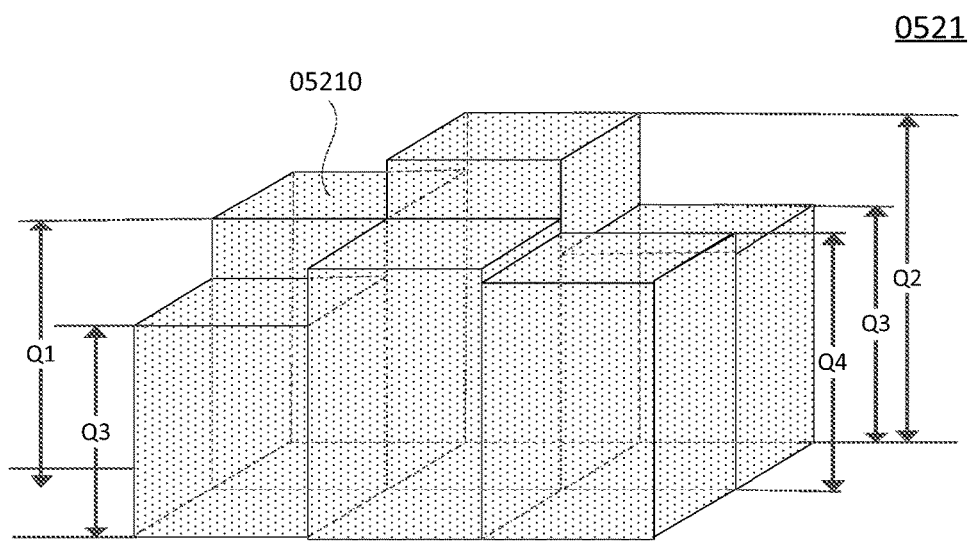
FIG. 20 illustrates a three-dimensional schematic of an exemplary first color resist unit of a display panel provided by various embodiments of the present disclosure.
Figure 21:
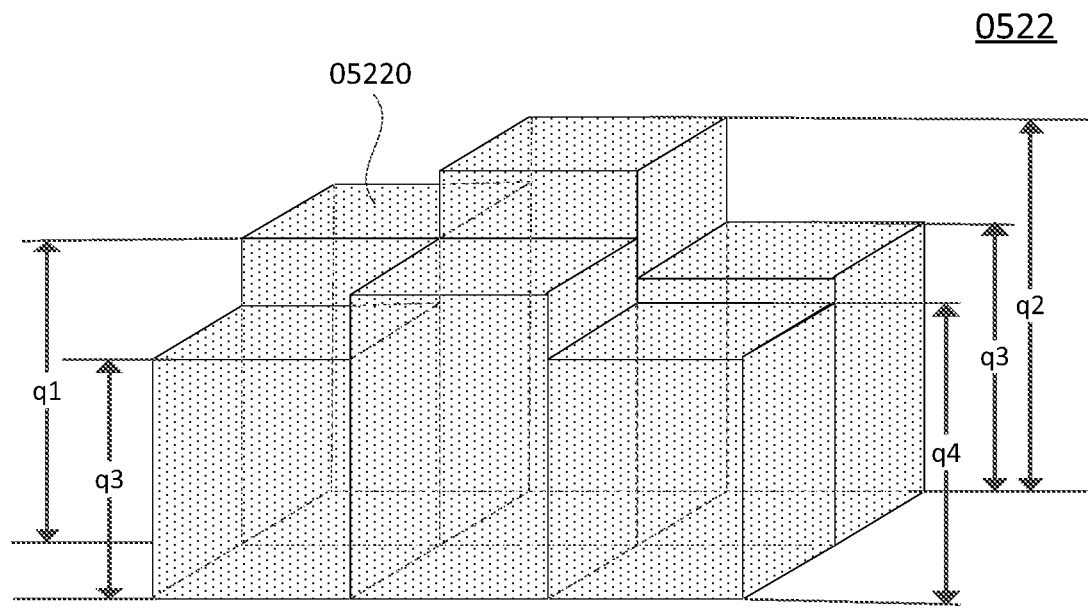
FIG. 21 illustrates a three-dimensional schematic of an exemplary second color resist unit of a display panel provided by various embodiments of the present disclosure.

FIG. 20 illustrates a three-dimensional schematic of an exemplary first color resist unit of the display panel provided by various embodiments of the present disclosure; and FIG. 21 illustrates a three-dimensional schematic of an exemplary second color resist unit of the display panel provided by various embodiments of the present disclosure. As shown in FIGS. 20-21, the first color resist unit 0521 may include 2 rows and 3 columns of sub-modules 05210, and the thickness of the sub-module in the 2nd row and the 3rd column is Q4; the second color resist unit 0522 may include 2 rows and 3 columns of sub-modules 05220, the thickness of the sub-module in the 2nd row and the 3rd column is q4, and Q4 is not equal to q4. The pattern similarity of the color resist units of a same color may be obtained through such two sub-modules, thereby improving the gating diffraction and reducing the rainbow stripe phenomenon. Optionally, q1, q2, q3, Q1, Q2, and Q3 in FIGS. 20-21 may not be limited according to various embodiments of the present disclosure. On the basis that Q4 is not equal to q4, the heights of other sub-modules may be configured as needed, that is, the quantity of the sub-modules with different thicknesses in corresponding positions in the color resist units may be one or more. It should be noted that the values of n and m may not be limited according to various embodiments of the present disclosure.

Optionally, the plurality of sub-modules in the first color resist unit may have different thicknesses, and the plurality of sub-modules in the second color resist unit may have different thicknesses. The sub-module at each thickness in the first color resist unit may have a corresponding sub-module of a same thickness in the second color resist unit. The sub-module at a certain thickness in the first color resist unit may have a corresponding sub-module of a same thickness in the second color resist unit. That is, if the first color resist unit has sub-modules with 4 thicknesses, the second color resist unit also has sub-modules with 4 thicknesses; and the arrangement manner of the sub-modules of different thicknesses in the first color resist unit may be different from the arrangement manner of the sub-modules of different thicknesses in the second color resist unit.

Figure 22:
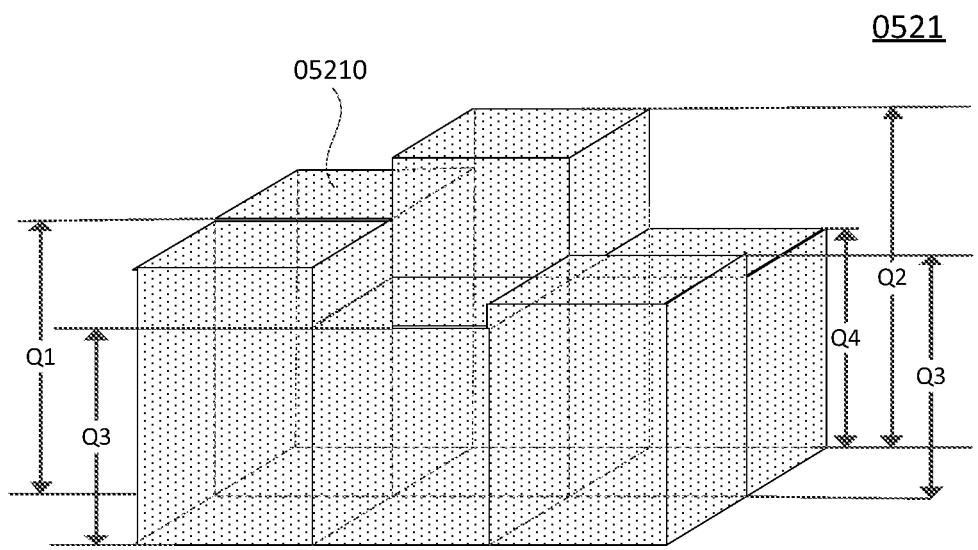
FIG. 22 illustrates a three-dimensional schematic of another exemplary first color resist unit of a display panel provided by various embodiments of the present disclosure.
Figure 23:
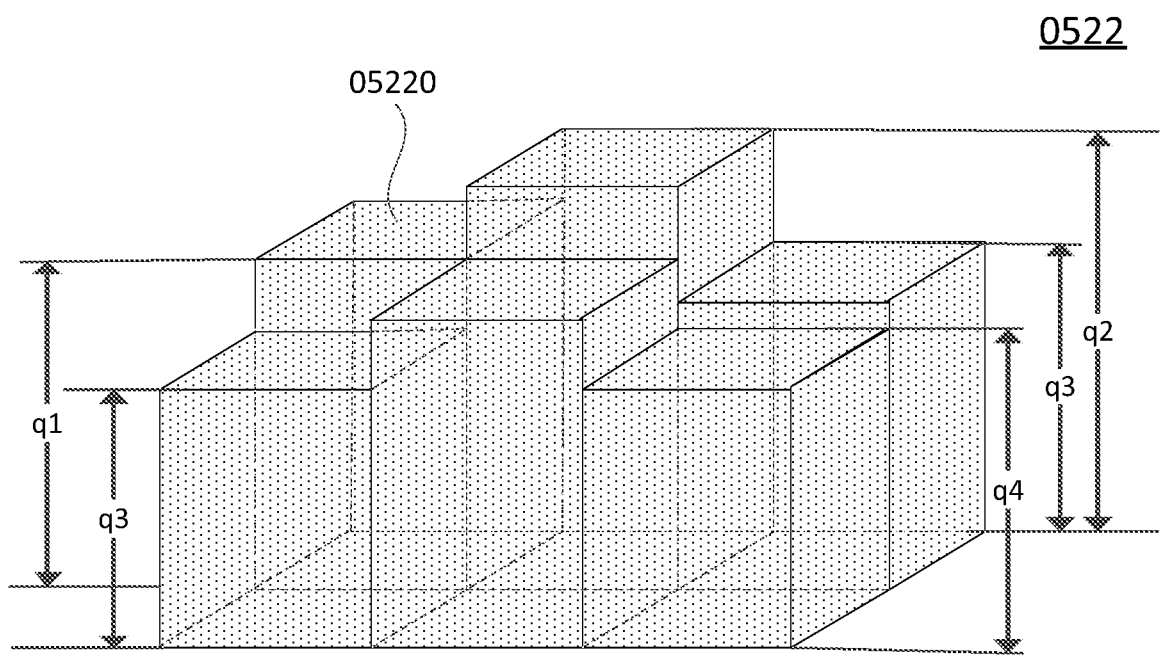
FIG. 23 illustrates a three-dimensional schematic of another exemplary second color resist unit of a display panel provided by various embodiments of the present disclosure.

FIG. 22 illustrates a three-dimensional schematic of another exemplary first color resist unit of the display panel provided by various embodiments of the present disclosure; and FIG. 23 illustrates a three-dimensional schematic of another exemplary second color resist unit of the display panel provided by various embodiments of the present disclosure. As shown in FIGS. 22-23, the first color resist unit 0521 may include sub-modules 052104 with 4 thicknesses which are Q1, Q2, Q3 and Q4 respectively; and the first color resist unit 0522 may include sub-modules 05220 with 4 thicknesses which are q1, q2, q3, and q4 respectively, where Q1=q1, Q2=q2, Q3=q3, and Q4=q4. In the first color resist unit 0521, the sub-modules with the height of Q1 may be respectively located at 1st row/1st column and at 2nd row/1st column. Correspondingly, in the second color resist unit 0522, the sub-modules with the height of q1 may be respectively located in 1st row/1st column and at 2nd row/2nd column. For the sub-modules of a same height, the arrangement manner in the first color resist unit may be different from the arrangement manner in the second color resist unit. Similarly, the sub-modules of other heights may not be repeated in detail herein. In one embodiment, the sub-modules of the first color resist unit and the sub-modules of the second color resist unit of a same height may be respectively disposed with different arrangement manners in the corresponding color resist units, thereby changing the morphology of the color resist units and improving the diffraction phenomenon.

Optionally, the color resist units may include a third color resist unit and a fourth color resist unit of a same color; the third color resist unit may include an opening portion; the fourth color resist unit may include an opening structure; and along the direction perpendicular to the plane of the substrate, the opening portion may pass through the third color resist, and the opening structure may pass through the fourth color resist unit.

Figure 24:
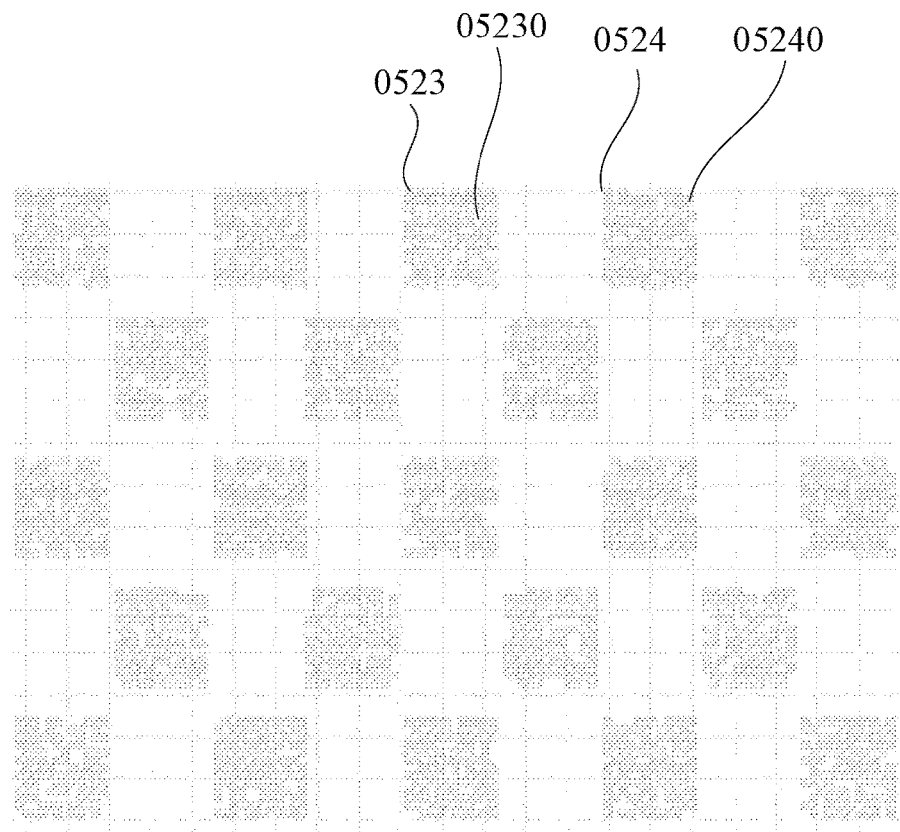
FIG. 24 illustrates a schematic top view of another exemplary display panel provided by various embodiments of the present disclosure.

FIG. 24 illustrates a schematic top view of another exemplary display panel provided by various embodiments of the present disclosure. As shown in FIG. 24, the color resist units may include a third color resist unit 0523 and a fourth color resist unit 0524; the third color resist unit 0523 may include an opening portion 05230 (the white blank region in FIG. 24); the fourth color resist unit 0524 may include an opening structure 05240; and along the direction perpendicular to the plane of the substrate, the opening portion 05230 may pass through the third color resist unit 0523, and the opening structure 05240 may pass through the fourth color resist unit 0524. The opening portion 05230 passes through the third color resist unit 0523, and the opening structure 05240 passes through the fourth color resist unit 0524, such that the orthographic projections of the color resist units on the second sub-plane may be changed. Meanwhile, the opening portions 05230 may be randomly distributed in the third color resist unit 0523, and the opening structures 05240 may be randomly distributed in the fourth color resist unit 0524. Therefore, the orthographic projection of the third color resist unit 0523 on the second sub-plane may be different from the orthographic projection of the fourth color resist 0521 on the second sub-plane; the color resist units of a same color may be differentiated in at least one dimension; and the dot matrix surface formed by at least one color resist unit may be changed. Correspondingly, the two-dimensional grating surface including the color resist units of a same color may be broken, and the regularity of grating diffraction may be obviously broken. Furthermore, the irregular distribution of the opening structures and the opening portions on the corresponding color resist units may increase the irregularity of the two-dimensional grating surface and change the structure of any two color resist units of a same color, thereby improving the blazed grating stripes to the maximum extent.

Optionally, for the irregular random arrangement, an arrangement regular pattern may not be found in at least one half of the area of one color resist unit.

Optionally, the projection area of the third color resist unit 0523 on the second sub-plane is S1, and the sum of the projection areas of all opening portions 05230 on the second sub-plane is S2, where $|(S1-S2)/(S1+S2)| \geq 66.7\%$. The area ratio of the opening portions 05230 in the third color resist unit 0523 may fluctuate to satisfy $|(S1-S2)/(S1+S2)| \geq 66.7\%$; and the area ratio of the opening portions 05230 in the third color resist unit 0523 may satisfy $S2 \leq 20\%$ S1. Excessively large ratio of the area sum of the opening portions 05230 may affect the pixel color gamut of the display panel and the overall reflectivity of the display panel. The area ratio of the opening portions in the third color resist unit may be less than or equal to 20%, which may balance the grating diffraction stripes and the display uniformity of the display panel.

Figure 25:
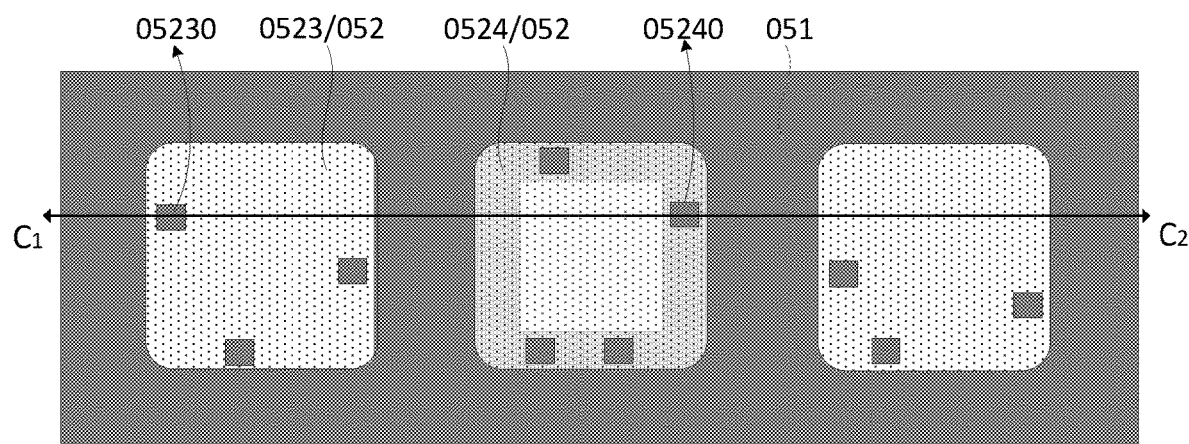
FIG. 25 illustrates a schematic top view of another exemplary display panel provided by various embodiments of the present disclosure.
Figure 26:
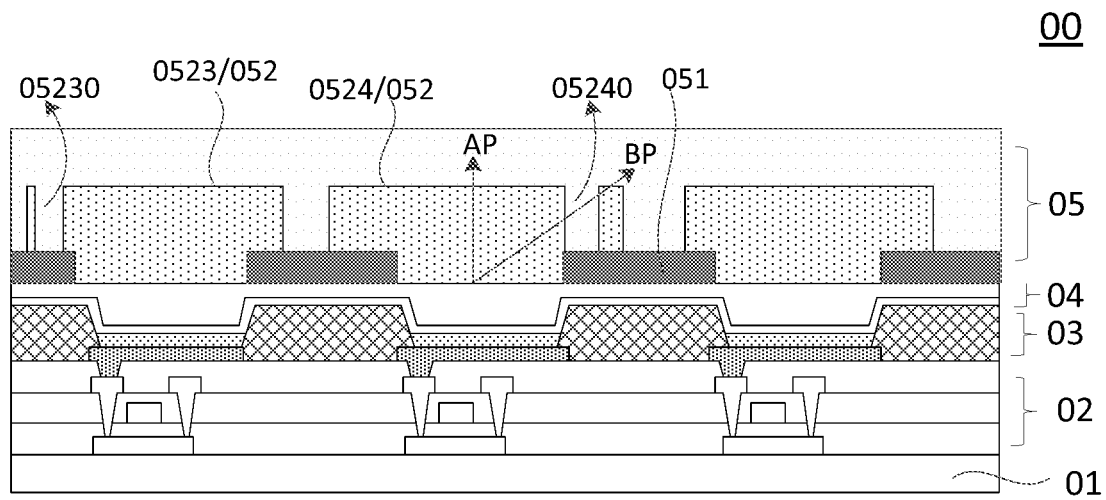
FIG. 26 illustrates a cross-sectional schematic of a display panel along an $C_1C_2$ direction in FIG. 25.

Optionally, the light-blocking portion may include a black matrix, which is used to reduce the ambient light reflection of the display panel and improve the anti-reflection ability. FIG. 25 illustrates a schematic top view of another exemplary display panel provided by various embodiments of the present disclosure; and FIG. 26 illustrates a cross-sectional schematic of the display panel along an $C_1C_2$ direction in FIG. 25. Referring to FIGS. 25-26, the orthographic projection of the color resist unit 052 on the substrate and the orthographic projection of the light-blocking portion 051 on the substrate may have an overlapped region; the opening portion 05230 and the opening structure 05240 may be located at the overlapped region; each of the third color resist unit 0523 and the fourth color resist unit 0524 may have an overlapped region with the black matrix 051 (i.e., the light-blocking portion); and the opening portion 05230 and the opening structure 0524 may be disposed at the overlapped region. Compared with previous embodiments, in one embodiment, on the one hand, the influence of the opening portion 05230 and the opening structure 05240 on the uniformity of light emitted by the light-emitting unit may be reduced, and the ambient light reflectivity of the display panel may also be reduced; on the other hand, the opening portion 05230 and the opening structure 05240 may be disposed at the edge region of the color resist unit may reduce the light exiting path passing through the color resist unit at the large viewing angle, reduce the brightness attenuation of the exited light from the large viewing angle, and balance the inconsistency in brightness attenuation between the front (e.g., center) viewing angle AP and the large viewing angle BP.

Figure 27:
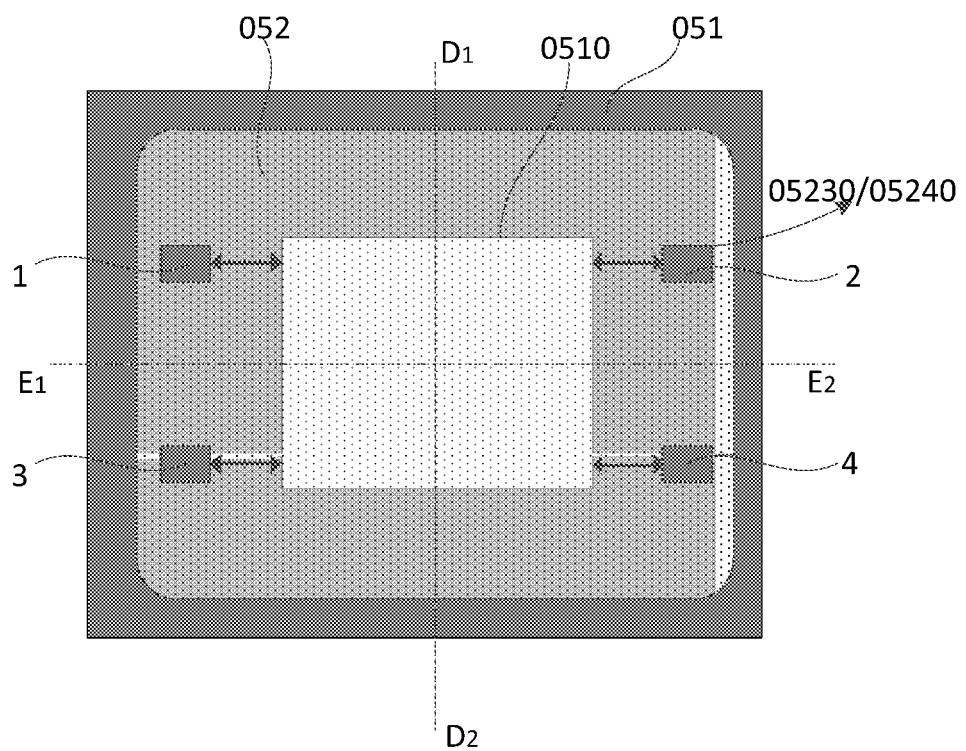
FIG. 27 illustrates a schematic top view of another exemplary display panel provided by various embodiments of the present disclosure.

FIG. 27 illustrates a schematic top view of another exemplary display panel provided by various embodiments of the present disclosure. As shown in FIG. 27, the black matrix 051 may include a hollowed structure 0510; and the hollowed structure 0510 may be disposed corresponding to the color resist unit. It should be understood that the hollowed structure 0510 may be used to provide a light-exiting channel for the color resist unit; and the shortest distances from the orthographic projections of the opening portions 05230 or the opening structures 05240 on the substrate to the hollowed structure 0510 in a same color resist unit may be equal to each other. As shown in FIG. 27, for example, the opening portion/opening structure may include a first opening 1, a second opening 2, a third opening 3, and a fourth opening 4. The shortest distances from all opening portions/opening structures to the hollowed structure 0510 may be equal to each other, which may ensure that the light-exiting brightness in all directions of the light-emitting unit may attenuate uniformly. Optionally, the first opening 1 and the second opening 2 may be symmetric with the symmetry axis D1D2, and the first opening 1 and the third opening 3 may be symmetric with the symmetry axis $E_1E_2$, where the symmetry axis D1D2 and the symmetry axis $E_1E_2$ may both be symmetry axes of the hollowed structure 0510. The irregular and random distribution of the opening portions/opening structures on different color resist units may be used to reduce the grating diffraction; and on such basis, the opening portions/opening structures of a same color resist unit may show a certain regularity, which may ensure the uniform attenuation of the brightness of the light exited from the light-emitting units in all directions, and improve the display quality.

Optionally, the light-blocking portion may be a black matrix, and the orthographic projection of the color resist unit on the substrate and the orthographic projection of the black matrix on the substrate may have an overlapped region; and the areas of the overlapped regions of the color resist units of a same color and adjacent black matrices may be same. It should be understood that the areas of the overlapped regions of the color resist units of a same color and the black matrices may be same; a same material printing volume may be used when the coating color resist is prepared in a process, which may simplify the preparation process. Furthermore, the resist units of the same color may have a same area and different shapes while ensuring the same color resist material printing volume, thereby reducing the grating diffraction.

Optionally, the shortest distance between two adjacent color resist units of a same color may be a non-fixed value. The color resist units of the same color in the display panel may be disposed arranged periodically (e.g., repeatedly). That is, the color resist units corresponding to the light-emitting units in the display panel may form the dot matrix surface, and the color resist units of the same color may form a two-dimensional grating surface; and the grating diffraction phenomenon may occur. The grating equation is d*sin (theta)=m*lambda, where d is the size of the grating period, m is the diffraction order, lambda is the wavelength, theta is the light diffraction angle corresponding to the diffraction order, and d value is fixed. The shortest distance between the color resist units may not be a fixed value, that is, the d value may not be fixed to break the regularity of grating diffraction. Optionally, adjacent color resist units may have a same shape and different distances. Optionally, adjacent color resist units may have different shapes and different adjustment distances.

Optionally, the black matrix may include a hollowed structure; the color resist units and the hollowed structures may be disposed in a one-to-one correspondence; the color resist unit may be at least in the hollowed structure; the hollowed structure may be a rectangle or a rounded rectangle; and the color resist unit may be a rectangle or a rounded rectangle. The orthographic projection of the hollowed structure on the second sub-plane may include a k-th sub-edge, and the orthographic projection of the color resist unit on the second sub-plane may include a k-th edge, where k∈{1, 2, 3, 4}. The k-th sub-edge may be disposed correspondingly to the k-th edge; the color resist units may include the fifth color resist unit and the sixth color resist unit with a same color; in the fifth color resist unit, the distance from the k-th sub-edge to the k-th edge is $L_{5k}$; and in the sixth color resist unit, the distance from the k-th sub-edge to the k-th edge is $L_{6k}$, where $L_{5k} \neq L_{6k}$.

Figure 28:
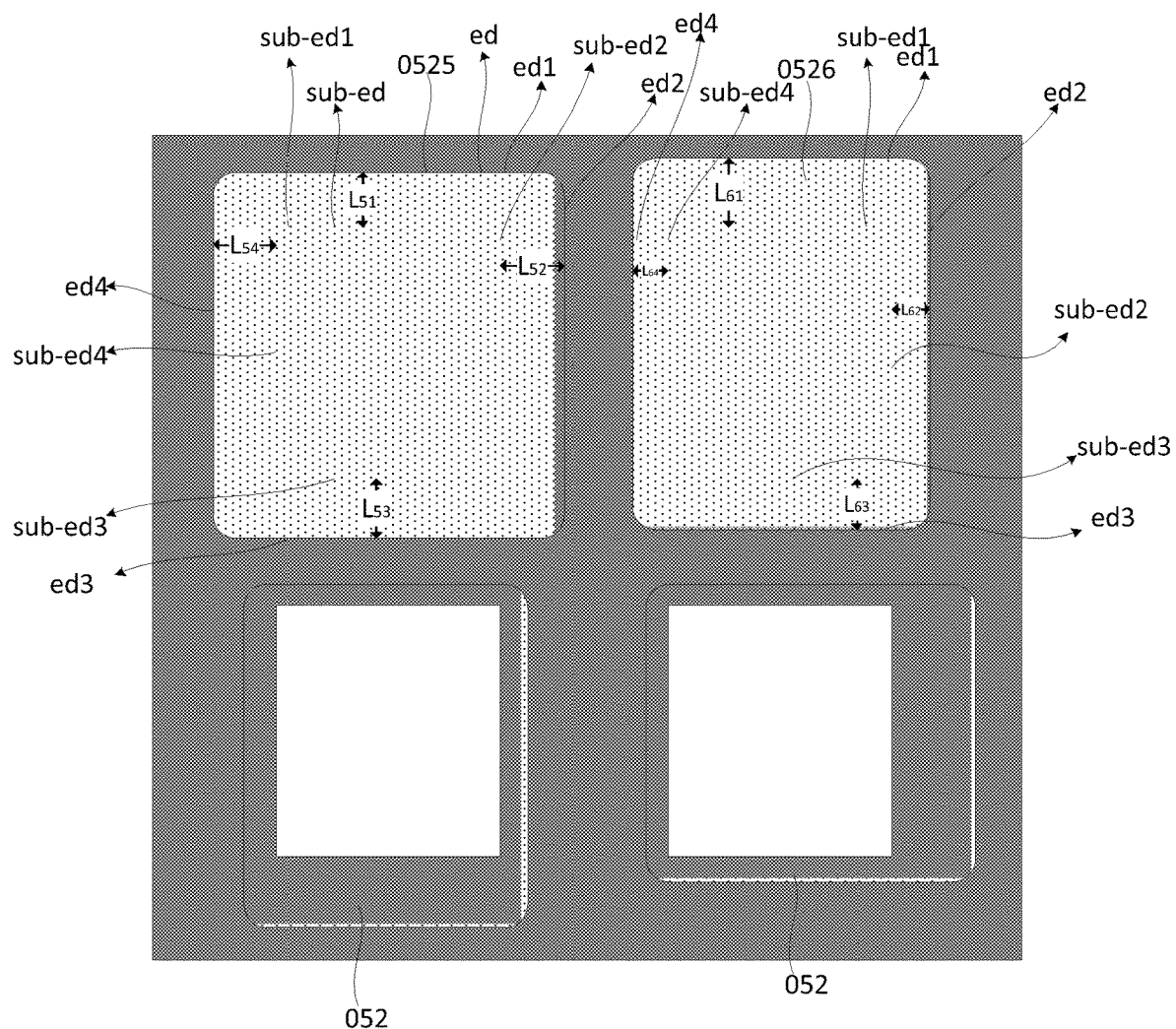
FIG. 28 illustrates a schematic top view of another exemplary display panel provided by various embodiments of the present disclosure.

FIG. 28 illustrates a schematic top view of another exemplary display panel provided by various embodiments of the present disclosure. As shown in FIG. 28, the color resist unit 052 may be at least located in the hollowed structure of the black matrix, the hollowed structure may be a rectangle or a rounded rectangle, and the color resist unit may be a rectangle or a rounded rectangle. The orthographic projection of the hollowed structure on the second sub-plane (not shown in FIG. 28) may include k (k=4) sub-edges (sub-ed), which are the first sub-edge (sub-ed1), the second sub-edge (sub-ed2), the third sub-edge (sub-ed3), and the fourth sub-edge (sub-ed4). The orthographic projection of the color resist unit on the second sub-plane may include k edges (ed), which are respectively the first edge (ed1), the second edge (ed2), the third edge (ed3), and the fourth edge (ed4), where the k-th sub-edge (sub-ed) may be disposed correspondingly to the k-th edge (ed). It can be understood that the k-th sub-edge (sub-ed) and the k-th edge (ed) may be disposed correspondingly, which can be understood as the extension direction of the k-th sub-edge (sub-ed) may be in panel with or substantially in parallel with the extension direction of the k-th edge (ed). The color resist units 052 may include the fifth color resist unit 0525 and the sixth color resist unit 0526 of a same color. In the fifth color resist unit 0525, the distance from the k-th sub-edge to the k-th edge is $L_{5k}$, and in the sixth color resist unit 0526, the distance from the k-th sub-edge to the k-th edge is $L_{6k}$, where $L_{5k} \neq L_{6k}$. Referring to FIG. 28, in the fifth color resist unit 0525, the distance from the first sub-edge (sub-ed1) to the first edge (ed1) is $L_{51}$, the distance from the second sub-edge (sub-ed2) to the second edge (ed2) is $L_{52}$, the distance from the third sub-edge (sub-ed3) to the third edge (ed3) is $L_{53}$, and the distance from the fourth sub-edge (sub-ed4) to the fourth edge (ed4) is $L_{54}$; in the sixth color resist unit 0526, the distance from the first sub-edge (sub-ed1) to the first edge (ed1) is $L_{61}$, the distance from the second sub-edge (sub-ed2) to the second edge (ed2) is $L_{62}$, the distance from the third sub-edge (sub-ed3) to the third edge (ed3) is $L_{63}$, and the distance from the fourth sub-edge (sub-ed4) to the fourth edge (ed4) is $L_{64}$, where $L_{51} \neq L_{61}$, $L_{52} \neq L_{62}$, $L_{53} \neq L_{63}$, and $L_{54} \neq L_{64}$. Since the hollowed structures of the black matrix and the light-emitting units are disposed correspondingly, the hollowed structures and the light-emitting units may be arranged in an array. The projection shapes of the color resist units of a same color may be changed by setting $L_{5k} \neq L_{6k}$, and the distance between two adjacent color resist units of a same color may be changed, which may reduce the grating diffraction and may not affect the display effect of the display panel compared with the existing technology.

Optionally, $L_{51}=L_{53}$, $L_{52}=L_{54}$, and on the opposite edges of the hollowed structure, the distances from the edges of the hollowed structure to the corresponding color resist units may be equal to each other. That is, in a same color resist unit, the color resist unit and a corresponding hollowed structure may have a same symmetric axis. Compared with the above-mentioned embodiments, it may ensure a same viewing-angle color cast degree under a same angle to optimize the display effect.

Optionally, the orthographic projections of the color resist units of a same color on the substrate may have a same area and different shapes. The same area may enable the color resist material printing volume to be same during the coating process or printing process of the color resist material. On the one hand, the different shapes of the color resist units may be achieved by the hollowed structures or openings of the above-mentioned embodiments; on the other hand, the lengths, widths or shapes of the color resist units may be simply changed to modify the dot matrix surface formed by the color resist units, thereby breaking the regularity of grating diffraction and improving the rainbow pattern.

Optionally, the black matrix may include a first portion and a second portion; the first portion may be located at the overlapped region; and the second portion may not overlap the color resist unit. The surface of the first portion away from the substrate may be a hydrophilic surface, and the surface of the second portion away from the substrate may be a hydrophobic surface. The color resist material may be an organic material, and the water content of organic materials may be higher than that of inorganic materials. By disposing the first portion at the overlapped region, the surface of the first portion away from the substrate may be a hydrophilic surface, and a hydrophobic material may be disposed in the second portion where the color resist unit is not needed. Compared with the existing technology, the color resist material may be locked at the overlapped region of the hydrophilic surface through the hydrophilic surface of the first portion and the hydrophobic surface of the second portion, which may avoid printing problems caused by the fluidity of the color resist material. Optionally, the surface of the first portion far away from the substrate is a hydrophilic surface, which may be achieved by adding molecules with polar groups to the black matrix material of the first portion to increase the affinity for water molecules and also by only coating a layer of hydrophilic film on the surface of the first portion of the overlapped region.

Figure 29:
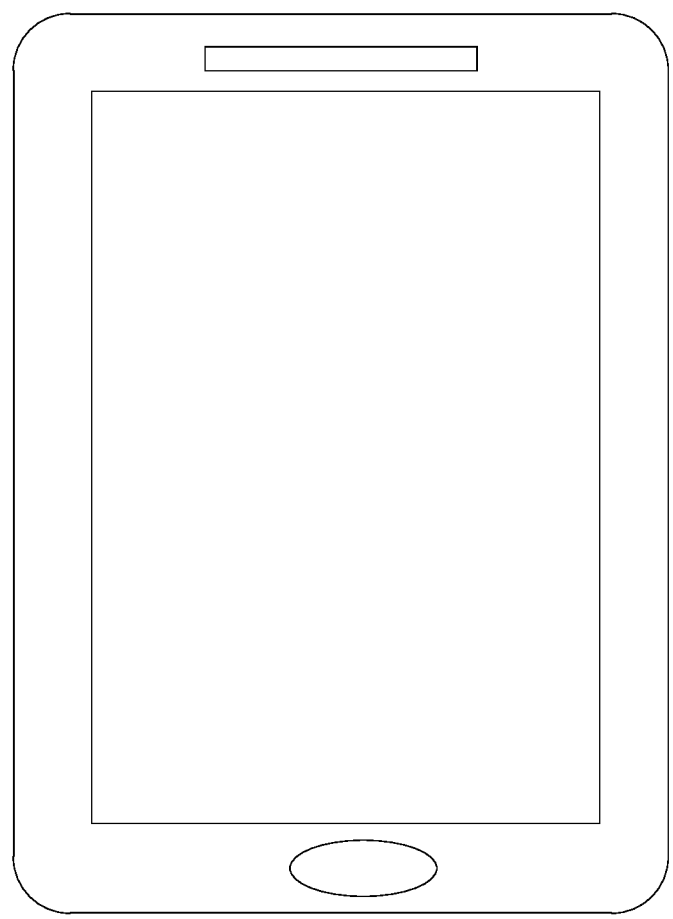
FIG. 29 illustrates a schematic of a display device provided by various embodiments of the present disclosure.

The present disclosure also provides a display device. FIG. 29 illustrates a schematic of a display device provided by various embodiments of the present disclosure. The display device may include the display panel provided by any embodiment of the present disclosure. The display devices provided by the present disclosure may include, but may not be limited to, the following categories: televisions, notebook computers, desktop displays, tablet computers, digital cameras, mobile phones, smart bracelets, smart glasses, car monitors, medical equipment, industrial control equipment, touch interactive terminals and the like.

From the above-mentioned embodiments, it can be seen that the display panel and its formation method, and the display device provided by the present disclosure may achieve at least the following beneficial effects.

For the display panel provided in various embodiments of the present disclosure, at least two color resist units of the same color may have different orthographic projection shapes on the same first plane, where the first plane may include at least one of the first sub-plane and the second sub-plane, the first sub-plane may be the plane perpendicular to the substrate, and the second sub-plane may be the plane in parallel with the substrate; at least two color resist units of the same color may have different orthographic projection shapes on the same plane perpendicular to the substrate; and/or at least two color resist units of the same color have different orthographic projection shapes on the same plane in parallel with the substrate. On the one hand, the diffuse reflection surface may be formed at the color resist unit, which reduces the brightness of the noticeable color stripes on the display panel along a certain fixed direction, thereby reducing the reflection effect of the color filter layer on the ambient light, improving the display contrast of the display panel, and further improving the light display effect of the display panel. On the other hand, the color resist units of the same color may be differentiated in at least one dimension, the dot matrix surface formed by at least one color resist unit may be changed, and correspondingly, the two-dimensional grating surface formed by color resist units of the same color may be broken to obviously break the regularity of grating diffraction, which may effectively reduce the grating diffraction phenomenon occurred between the exiting external light which is reflected by the anode of the light-emitting unit and passes through the color resist blocks of the same color, or between the reflected external light which directly passes through the color resist blocks of the same color.

The above-mention content is a further detailed description of the present disclosure in conjunction with some optional embodiments, which may not be considered that the actual implementation of the present disclosure is limited to such descriptions. For those skilled in the art in the technical field to which the present disclosure belongs, a plurality of simple deductions or substitutions may be made without departing from the concept of the present disclosure, which should be regarded as falling within the protection scope of the present disclosure.

What is claimed is:

1. A display panel, comprising:
    a substrate and an array layer disposed on a side of the substrate;
    a light-emitting layer, wherein the light-emitting layer is on a side of the array layer away from the substrate and includes a plurality of light-emitting units; and
    a color filter layer, wherein the color filter layer includes a light-blocking portion and a plurality of color resist units; the plurality of color resist units is disposed corresponding to the plurality of light-emitting units; at least two color resist units of a same color have different orthographic projection shapes on a same first plane; a first plane at least includes one of a first sub-plane and a second sub-plane; the first sub-plane is a plane perpendicular to the substrate; and the second sub-plane is a plane in parallel with the substrate, wherein
        the plurality of color resist units includes a first color resist unit a surface of the first color resist unit on a side away from the substrate is a first surface; the first color resist unit includes a plurality of first grooves; and the plurality of first grooves is formed by recessing the first surface toward the side of the substrate.

2. The display panel according to claim 1, wherein:
    depths of at least two first grooves are different; and
    the plurality of color resist units further includes a second color resist unit having a same color as the first color resist unit; a surface of the second color resist unit on the side away from the substrate is a second surface; the second color resist unit includes a plurality of second grooves; the plurality of second grooves is formed by recessing the second surface toward the side of the substrate; and depths of at least two second grooves are different.

3. The display panel according to claim 2, wherein:
    the first color resist unit and the second color resist unit have different patterns at a first cross section; and the first cross section is a plane perpendicular to a substrate plane and passing through a geometric center of the first color resist unit and a geometric center of the second color resist unit.

4. The display panel according to claim 2, wherein:
    the plurality of first grooves includes M types of groove portions with different depths, wherein a depth of an i-th groove portion is Di and i∈{1, . . . , M}; the plurality of second grooves includes N types of groove structures with different depths, wherein a depth of a j-th groove structure is dj, j∈{1, . . . , N}, M>N, M is a positive integer, and N is a positive integer.

5. The display panel according to claim 4, wherein:
    M=N and Di=dj; and a position of the i-th groove portion in the first color resist unit is different from a position of the j-th groove structure in the second color resist unit; or an arrangement manner of the i-th groove portion in the first color resist unit is different from an arrangement manner of the j-th groove structure in the second color resist unit.

6. The display panel according to claim 4, wherein:
    Di=dj, and an area ratio of the i-th groove portion in the first color resist unit is C, and an area ratio of the j-th groove structure in the second color resist unit is E, wherein C≠E.

7. The display panel according to claim 4, wherein:
    Di=dj, a shortest distance between two adjacent groove portions is mi, and a shortest distance between two adjacent groove structures is mj, wherein mi≠mj.

8. The display panel according to claim 4, wherein:
    an orthographic projection of the color resist unit on the substrate and an orthographic projection of a black matrix on the substrate at least have an overlapped region; and a first groove and a second groove are at the overlapped region.

9. The display panel according to claim 2, wherein:
    each of the first color resist unit and the second color resist unit includes n*m sub-modules arranged in an array of n rows and m columns; and a thickness of a corresponding sub-module at an f-th row and a g-th column in the first color resist unit is equal to a thickness of a corresponding sub-module at an f-th row and a g-th column in the second color resist unit, wherein f≤n and g≤m.

10. The display panel according to claim 9, wherein:
    a plurality of sub-modules in the first color resist unit has different thicknesses; a plurality of sub-modules in the second color resist unit has different thicknesses; and a sub-module at each thickness in the first color resist unit has a corresponding sub-module of a same thickness in the second color resist unit.

11. The display panel according to claim 1, wherein:
    a light-blocking portion includes a black matrix; and an orthographic projection of a color resist unit on the substrate and an orthographic projection of the black matrix on the substrate have an overlapped region; and an area of an overlapped region between one color resist unit and an adjacent black matrix is equal to an area of an overlapped region between a color resist unit, having a same color as the one color resist unit, and an adjacent black matrix.

12. The display panel according to claim 11, wherein:
    a shortest distance between two adjacent color resist units of a same color is a non-fixed value.

13. The display panel according to claim 12, wherein:
the black matrix includes a hollowed structure; and the color resist unit and the hollowed structure are disposed in a one-to-one correspondence; the color resist unit is at least at the hollowed structure; the hollowed structure includes a rectangular or rounded rectangle; and the color resist unit includes a rectangular or rounded rectangle;
an orthographic projection of the hollowed structure on the second sub-plane includes a k-th sub-edge, and an orthographic projection of the color resist unit on the second sub-plane includes a k-th edge, wherein k∈{1, 2, 3, 4}, and the k-th sub-edge is disposed corresponding to the k-th edge; and
the plurality of color resist units includes a fifth color resist unit and a sixth color resist unit having a same color as the fifth color resist unit; in the fifth color resist unit, a distance from the k-th sub-edge to the k-th edge is L5k; and in the sixth color resist unit, a distance from the k-th sub-edge to the k-th edge is L6k, wherein L5k≠L6k.

14. The display panel according to claim 12, wherein:
in the fifth color resist unit, a distance from a first sub-edge to a first edge is L51, and a distance from a second sub-edge to a second edge is L52, a distance from a third sub-edge to a third edge is L53, and a distance from a fourth sub-edge to a fourth edge is L54; the first sub-edge and the third sub-edge are disposed opposite to each other; and the first edge and the third edge are disposed opposite to each other, wherein L51=L53, and L52=L54.

15. The display panel according to claim 11, wherein:
the black matrix includes a first portion and a second portion; the first portion is at the overlapped region; the second portion does not overlap the color resist unit; a surface of the first portion away from the substrate includes a hydrophilic surface; and a surface of the second portion away from the substrate includes a hydrophobic surface.

16. A display panel, comprising:
a substrate and an array layer disposed on a side of the substrate;
a light-emitting layer, wherein the light-emitting layer is on a side of the array layer away from the substrate and includes a plurality of light-emitting units; and
a color filter layer, wherein the color filter layer includes a light-blocking portion and a plurality of color resist units; the plurality of color resist units is disposed corresponding to the plurality of light-emitting units; at least two color resist units of a same color have different orthographic projection shapes on a same first plane; a first plane at least includes one of a first sub-plane and a second sub-plane; the first sub-plane is a plane perpendicular to the substrate; and the second sub-plane is a plane in parallel with the substrate, wherein
the plurality of color resist units includes a third color resist unit and a fourth color resist unit having a same color as the third color resist unit; the third color resist unit includes an opening portion; the fourth color resist unit includes an opening structure; and along a direction perpendicular to a substrate plane, the opening portion passes through the third color resist unit, and the opening structure passes through the fourth color resist unit.

17. The display panel according to claim 16, wherein:
a projection area of the third color resist unit on the second sub-plane is S1; and
a sum of projection areas of all opening portions on the second sub-plane is S2, wherein $|(S1-S2)/(S1+S2)| \geq 66.7\%$.

18. The display panel according to claim 16, wherein:
a light-blocking portion includes a black matrix; and
an orthographic projection of a color resist unit on the substrate and an orthographic projection of the light-blocking portion on the substrate have an overlapped region; and the opening portion and the opening structure are at the overlapped region.

19. The display panel according to claim 18, wherein:
the black matrix includes a hollowed structure disposed corresponding to the color resist unit; and
shortest distances from orthographic projections of opening portions or opening structures on the substrate to an orthographic projection of the hollowed structure in a same color resist unit equal to each other.

20. A display device, comprising:
a display panel, comprising:
a substrate and an array layer disposed on a side of the substrate;
a light-emitting layer, wherein the light-emitting layer is on a side of the array layer away from the substrate and includes a plurality of light-emitting units; and
a color filter layer, wherein the color filter layer includes a light-blocking portion and a plurality of color resist units; the plurality of color resist units is disposed corresponding to the plurality of light-emitting units; at least two color resist units of a same color have different orthographic projection shapes on a same first plane; a first plane at least includes one of a first sub-plane and a second sub-plane; the first sub-plane is a plane perpendicular to the substrate; and the second sub-plane is a plane in parallel with the substrate, wherein
the plurality of color resist units includes a first color resist unit a surface of the first color resist unit on a side away from the substrate is a first surface; the first color resist unit includes a plurality of first grooves; and the plurality of first grooves is formed by recessing the first surface toward the side of the substrate.

* * * * *